United States Patent
Tanizaki

(10) Patent No.: US 7,050,349 B2
(45) Date of Patent: May 23, 2006

(54) SEMICONDUCTOR INTEGRATED CIRCUIT DEVICE AND SEMICONDUCTOR MEMORY DEVICE REPROGRAMMABLE AFTER ASSEMBLY

(75) Inventor: Hiroaki Tanizaki, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 406 days.

(21) Appl. No.: 10/120,442

(22) Filed: Apr. 12, 2002

(65) Prior Publication Data

US 2002/0196681 A1 Dec. 26, 2002

(30) Foreign Application Priority Data

Jun. 25, 2001 (JP) ............................. 2001-191148

(51) Int. Cl.
*G11C 7/00* (2006.01)

(52) U.S. Cl. .................... 365/225.7; 365/233
(58) Field of Classification Search ............. 365/225.7, 365/154, 189.07, 203, 233
See application file for complete search history.

(56) References Cited

U.S. PATENT DOCUMENTS 6,166,981 A * 12/2000 Kirihata et al. .......... 365/225.7
6,191,982 B1 * 2/2001 Morgan ...................... 365/200
6,426,911 B1 * 7/2002 Lehmann et al. ........ 365/225.7
2001/0046170 A1 * 11/2001 Sher et al. .................. 365/226

FOREIGN PATENT DOCUMENTS

GB   2 349 249      10/2000
JP   2000-207896    7/2000

OTHER PUBLICATIONS

S. Fujii, et al *"A Low–Power Sub 100 NS 256K Bit Dynamic RAM"* IEEE Journal of Solid–State Circuits, vol. SC–18, No. 5, Oct. 1983, pp. 441–446.

* cited by examiner

*Primary Examiner*—Thong Le
(74) *Attorney, Agent, or Firm*—McDermott Will & Emery LLP

(57) ABSTRACT

A programming circuit includes an LT fuse read circuit programming a defective address during a wafer-processing, an electrical fuse circuit electrically programming a defective address, an electrical fuse circuit storing therein whether the electrical fuse circuit is used, a select circuit receiving data programmed by the LT fuse and that programmed by the electrical fuse for switch and output, an electrical fuse circuit designating a switching of the select circuit, and a repair decision circuit comparing an output received from the select circuit and an input address received from the address buffer.

11 Claims, 24 Drawing Sheets

RESULT OF SUBSTITUTION WITH LT FUSE

RESULT OF REPROGRAMMING WITH ELECTRICAL FUSE

ELECTRICAL FUSE BLOW OPERATION

OPERATION WITHOUT FUSE BLOWN

FIG.13

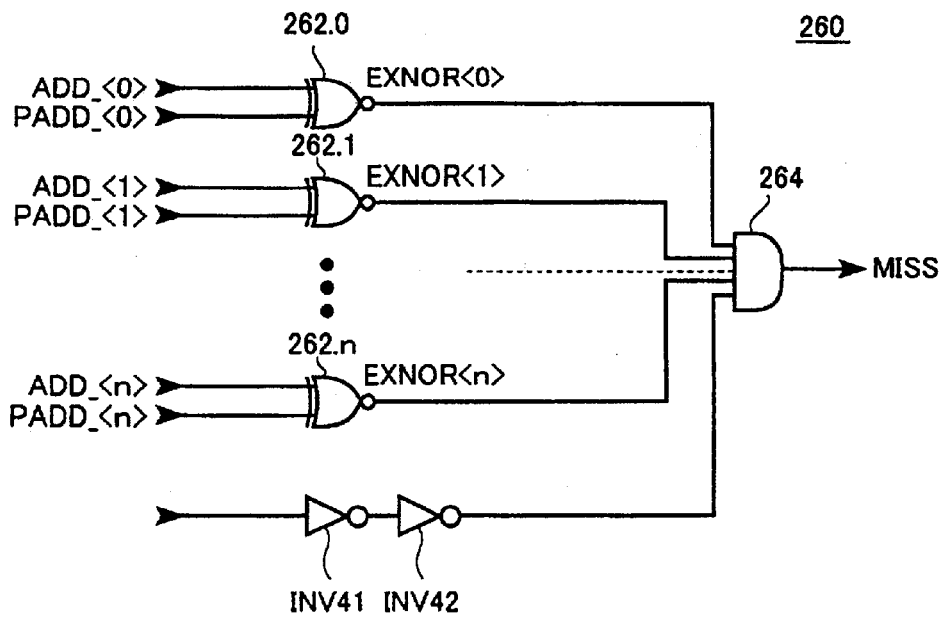

FIG.14

INPUT ADDRESS AND RESULT OF
COMPARISON WHEN LT FUSE IS USED

| BLOW OPERATION | | ADDRESS DECISION OPERATION | | | |
|---|---|---|---|---|---|
| LT FUSE | PADD_LT READ | PADD | ADD | MISS | REPAIR |
| NOT BLOWN | Low | Low | Hight | Low | REGULAR |
| | | | Low | Hight | REDUNDANT |
| BLOWN | Hight | Hight | Hight | Hight | REDUNDANT |
| | | | Low | Low | REGULAR |

FIG.15

INPUT ADDRESS AND RESULT OF COMPARISON
WHEN ELECTRICAL FUSE IS USED

| BLOW OPERATION | | | ADDRESS DECISION OPERATION | | | |
|---|---|---|---|---|---|---|
| ADD BLOW SIGNAL | ELECTRICAL FUSE | PADD_LT READ | PADD | ADD | MISS | REPAIR |
| Low | NOT BLOWN | Low | Low | Hight | Low | REGULAR |
| | | | | Low | Hight | REDUNDANT |
| Hight | BLOWN | Hight | Hight | Hight | Hight | REGULAR |
| | | | | Low | Low | REDUNDANT |

FIG.18

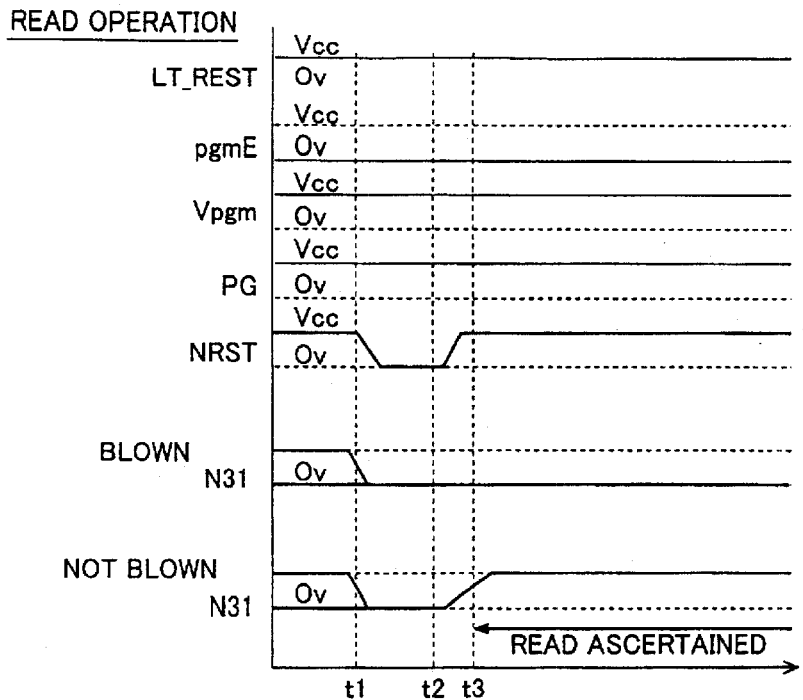

FIG.19

INPUT ADDRESS AND RESULT OF
COMPARISON WHEN LT FUSE IS USED

| BLOW OPERATION | | ADDRESS DECISION OPERATION | | | |
|---|---|---|---|---|---|
| LT FUSE | PADD READ | PADD | ADD | MISS | REPAIR |
| NOT BLOWN | Hight | Hight | Hight | Hight | REDUNDANT |
| | | | | Low | REGULAR |
| BLOWN | Low | Low | Hight | Low | REGULAR |
| | | | | Low | Hight | REDUNDANT |

FIG.20

INPUT ADDRESS AND RESULT OF COMPARISON
WHEN ELECTRICAL FUSE IS USED

| BLOW OPERATION | | | ADDRESS DECISION OPERATION | | | |
|---|---|---|---|---|---|---|
| ADD BLOW SIGNAL | ELECTRICAL FUSE | PADD READ | PADD | ADD | MISS | REPAIR |
| Low | NOT BLOWN | Low | Low | Hight | Low | REGULAR |
| | | | | Low | Hight | REDUNDANT |
| Hight | BLOWN | Hight | Hight | Hight | Hight | REDUNDANT |
| | | | | Low | Low | REGULAR |

FIG.26 FUSE BLOW OPERATION

FUSE BLOW OPERATION

SEMICONDUCTOR INTEGRATED CIRCUIT DEVICE AND SEMICONDUCTOR MEMORY DEVICE REPROGRAMMABLE AFTER ASSEMBLY

BACKGROUND OF THE INVENTION

1. Field of the Invention

The present invention relates to semiconductor integrated circuit devices capable of storing data for example of a memory circuit and semiconductor memory devices using the same.

2. Description of the Background Art

If a memory circuit such as dynamic random access memory (DRAM) has defect, a semiconductor integrated circuit device with such a memory circuit mounted thereon is not allowed to be shipped as a product. However, producing a defectless product is disadvantageously associated with significantly reduced yield.

Conventionally, such a defect can be replaced by a spare memory cell. More specifically it is typically substituted by a previously arranged memory cell for redundant repair substitution.

More specifically, for a memory circuit with memory cells arranged in an array of rows and columns, a spare plurality of rows and columns are provided and a defective memory cell or line can be substituted with a spare line and thus repaired to increase the yield of defectless chips on a wafer.

This system requires for example that in conducting an in-line test of a wafer any defective addresses be previously programmed and the wafer be then divided into chips and assembled, and thereafter when it is actually used, row and column addresses input be constantly monitored and when a defective address input is detected it be substituted with a spare line.

One such internal circuit generally used is a fuse bank-address detection circuit using laser to cut a polysilicon interconnection, aluminum interconnection and the like, as described for example in IEEE Journal of Solid-State Circuits, Vol. SC-18, No. 5, October 1983, pp. 441–446.

FIG. 29 is a circuit diagram for illustrating a configuration of a conventional fuse bank-address detection circuit 9000.

Between an internal node n1 and a ground potential is connected a set of a fuse element F11 and a transistor 11 having a gate receiving an internal address signal a1 and connected in series with fuse element F11. For each of an inverted version of internal address signal a1, or an internal address signal /a1, and other internal address signals a2, /a2 to am, /am, there is also provided a respective set of one of similar fuse elements F12–Fm2 and one of similar transistors T12–Tm2.

Internal node n1 is provided with a precharge transistor TP activated by a signal RP to precharge a level of node N1.

In other words, in a decoder of a spare line (hereinafter referred to as a spare decoder) complementary internal addresses are input to the gates of transistors T11–Tm2.

Of fuse elements F11–Fm2, a fuse element corresponding to a defective address is previously cut by laser to program the defective address. When an input address and the programmed, defective address match, an inactivation indicating signal φDA is output to a regular decoder connected to the defective line, to substitute the defective line with a spare line.

Conventional fuse bank-address detection circuit 9000 is disadvantageous as it requires an expensive laser cutter device and the precision in cutting a fuse is also concerned. Such disadvantages are conventionally overcome by an anti-fuse address detection circuit 9100 using an anti-fuse in the form of an electrical fuse.

FIG. 30 is a circuit diagram for illustrating a configuration of such an anti-fuse address detection circuit 9100.

As shown in FIG. 30, anti-fuse address detection circuit 9100 includes an inverter INV110 with an internal node n1 and an input node coupled, an inverter INV120 receiving an output from inverter INV110 in a signal SOUT. Inverter INV120 includes a P channel MOS transistor PQ1 and an N channel MOS transistor NQ1 coupled in series between a power supply potential VCC and a ground potential. Transistors PQ1 and NQ1 have their respective gates both receiving signal SOUT. Inverters INVs110 and 120 together form a latch circuit. An n channel MOS transistor NQ2 is provided between internal nodes N1 and N2 and has a gate receiving power supply potential Vcc.

Furthermore between node N2 and a program signal Vpgm is connected a capacitance element AF1 operating as an anti-fuse element.

Furthermore between node N1 and power supply potential Vcc is provided a P channel MOS transistor PQ3 having a gate receiving a precharge signal PG. Between node N1 and a ground potential is provided an N channel MOS transistor NQ3 having a gate receiving a signal SA.

FIGS. 31–33 are timing plots for illustrating an operation of the FIG. 30 anti-fuse address detection circuit 9100.

Initially with reference to FIG. 31 a fuse blow operation will be described.

At time t1 program signal PG is set low and transistor PQ3 turns on. Thus the latch circuit formed by inverter INV110 and transistors PQ1 and NQ1 is initialized, and node N1 attains a high level.

Then at time t2 program signal PG is set low and signal SA is subsequently set high. Thus, after the latch circuit's node N1 held low, signal SA is set low.

Then at time t3 signal Vpgm is input in a high voltage VCCH. With node N1 having the low level, transistor NQ2 thus turns on and node N2 is driven low.

Between opposite terminals of fuse element AF1 a difference in potential of program potential Vpgm is introduced. Thus, fuse element AF1, receiving a high voltage, would receive high voltage VCCH higher than a breakdown voltage, and thus have breakdown and hence short-circuit.

At time t4 short circuit is introduced, and node N1 gradually goes high. When a logical value of inverter INV110 is exceeded, a level held by the latch circuit is inverted. When the latch circuit is inverted and node N1 goes high, the transistor NQ2 gate attains a potential equal to that of node N1 and transistor NQ2 has a gate-source voltage Vgs of zero volt, and transistor NQ2 turns off. Since transistor NQ2 is shut down, current does not flow to the ground from a node receiving signal Vpgm, after fuse element AF1 has blown.

Herein, inverting a level held by the latch circuit entails a fuse resistance having the same level as the ON resistance of transistor NQ1.

Reference will now be made to FIG. 32 to describe an operation provided when fuse element AF1 is not blown.

At the time t1 signal PG is driven low and the latch circuit is initialized.

At time t2 signal PG is set high to allow the latch circuit to have node N1 held high.

Furthermore at time t3 signal Vpgm is applied in voltage VCCH higher than power supply voltage Vcc.

However, node N1 has the high level and the transistor NQ2 gate receives a high level (the power supply potential VCC level), and transistor NQ2 thus has a source-gate voltage of 0V and it thus has an OFF state. Thus, node N2 applies high voltage Vpgm to transistor NQ2 at the drain and simultaneously rises to potential Vpgm through coupling. Thus also between node N2 and voltage Vpgm a voltage of approximately 0V is attained and the fuse element thus does not break down.

Reference will now be made to FIG. 33 to describe a read operation of anti-fuse address detection circuit 9100.

Initially, signal Vpgm and signal PG are set high (the power supply voltage Vcc level). Then between time t1 and time t2 signal SA is driven high to initialize the latch circuit. In response, node N1 attains a low level.

At time t2 signal SA attains a low level and if a fuse is not blown node N1 is held low.

If a fuse has been blown, the node N1 potential rises from a low level to a potential equal to potential Vpgm since transistor NQ2 conducts and fuse element AF1 is short-circuited, and when the node N1 potential exceeds a logical threshold value of inverter INV110 the latch is inverted and node N1 is held high. These two latch states can be used to program address decision, circuit-tuning, and the like.

As has been described above, in laser-trimming a fuse, a beam of laser is directed to a wire of an LSI still in the form of a wafer to blow the wire and thus program a defective address. If a defect is introduced after packaging, however, the LSI chip of interest in the package cannot receive a beam of laser and it thus cannot be repaired by a laser-trimming fuse (hereinafter referred to as an "LT fuse"). In other words, a semiconductor integrated circuit having been divided into chips and packaged cannot be trimmed if its fuse are adapted to be optically, externally heated and thus cut.

For an electrical fuse, in contrast, stress is applied to a capacitance to program a state, and programming a defective address is thus time-consuming and increases cost relative to time. Furthermore, blowing an electrical fuse requires applying a high voltage. Reliably blowing an electrical fuse requires a high voltage to be applied. However, if the voltage is increased too high, a transistor other than the fuse element receives voltage and a gate which is not subject to destruction may be destroyed. As such, too high a voltage should not be applied.

Thus, for an LT fuse, a beam of laser is used to cut a wire on a wafer to program a defective address. If a defect is introduced after packaging, however, a conventional LT fuse alone cannot repair the defective address.

Furthermore, if an electrical fuse is alone used, stress is applied to a capacitance for destruction, and it is thus time-consuming to program an address to be repaired and it is thus difficult to program it reliably and also in a short period of time.

SUMMARY OF THE INVENTION

The present invention contemplates a semiconductor integrated circuit device and semiconductor memory device capable of a program operation in a short period of time reliably.

The present invention generally provides a semiconductor integrated circuit device storing program data therein and outputting data corresponding to the program data stored, including: a plurality of fuse elements capable of optically blowing; a plurality of fuse read circuits provided to correspond to the plurality of fuse elements, respectively, and each changing an output level in response to whether a corresponding one of the fuse elements has been blown; an electrical program circuit capable of storing the program data therein when an external electrical signal is applied; and a switch circuit capable of setting in a non-volatile manner which one of an output of the plurality of fuse read circuits and an output of the electrical program circuit to be output as data corresponding to the program data.

The present invention in another aspect provides a semiconductor integrated circuit device storing program data therein and outputting data corresponding to the program data stored, including: a first fuse program circuit having a plurality of first fuse elements and capable of receiving an external electrical signal to cut off the plurality of first fuse elements to store the program data therein; and a second fuse program circuit having a plurality of second fuse elements and capable of receiving an external electrical signal to cut off the plurality of second fuse elements to rewrite the program data stored in the first fuse program circuit.

The present invention in still another aspect provides a semiconductor memory device including: a memory cell array having a plurality of memory cell arrays arranged in rows and columns, the memory cell array including a regular memory cell array and a spare memory cell array; a regular memory cell select circuit operative in response to an address signal to select a memory cell in the regular memory cell array; a spare memory cell select circuit operative in response to a result of comparing previously stored program data and the address signal, to select a memory cell in the spare memory cell array rather than a memory cell in the regular memory cell array; and a program circuit storing therein the program data in a non-volatile manner, the program circuit including a first non-volatile program circuit having a plurality of first fuse elements to store the program data herein, and a second non-volatile program circuit capable of storing the program data therein in a non-volatile manner in response to an external electrical signal being applied to rewrite the program data stored in the first fuse program circuit.

Advantageously the present semiconductor integrated circuit device still in the form of a wafer can use a fuse element to effect programming and the device after it is packaged can use an electrical fuse to effect programming for repair to change program information in response to a variation introduced after the programming effected by the fuse element. Thus the final yield of the semiconductor integrated circuit device can be increased.

Advantageously the present semiconductor memory device still in the form of a wafer can use a fuse element to effect programming to repair a defect and the device after it is packaged can use an electrical to repair a defect. Thus the yield of the device can be increased efficiently. Furthermore the present semiconductor memory device can use an electrical fuse to reprogram one repaired by a fuse element and even after assembly it can flexibly effect programming to repair a defective memory cell more efficiently.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings:

FIG. 13 is a circuit diagram for illustrating a configuration of a repair decision circuit 260;

FIG. 14 represents a correspondence between a result of blowing an LT fuse and a result of a repair;

FIG. 15 represents a correspondence between a result of blowing an electrical fuse and a result of a repair;

FIG. 18 is a timing plots for illustrating a read operation of a partial fuse circuit 450;

FIG. 19 is a first diagram representing a correspondence between a result of blowing a fuse and a result of a repair;

FIG. 20 is a first diagram representing a correspondence between a result of blowing a fuse and a result of a repair;

DESCRIPTION OF THE PREFERRED EMBODIMENTS

Hereinafter the embodiments of the present invention will be described with reference to the drawings.

First Embodiment

Figure 1:
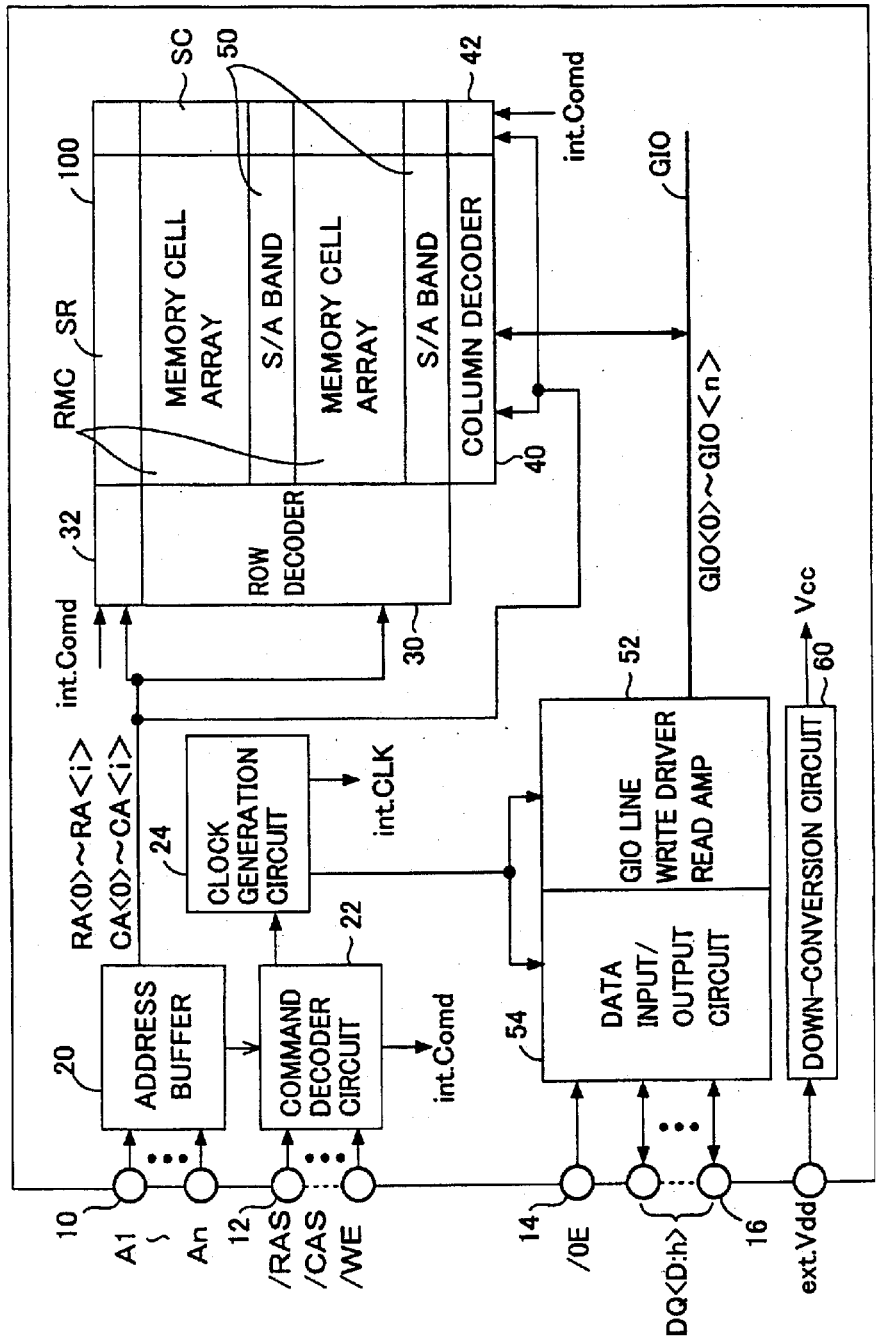
FIG. 1 is a block diagram schematically showing a configuration of a DRAM 1000 using a program circuit of the present invention.

FIG. 1 is a schematic block diagram showing a configuration of a DRAM 1000 using a program circuit of the present invention.

As will be apparent from the following description, the present invention can provide a program circuit applicable not only to a semiconductor chip with DRAM 1000 alone integrated thereon but also to a semiconductor chip with a DRAM and a logic circuit integrated thereon. Furthermore, the present program circuit is also applicable not only to redundantly repairing a memory circuit such as a DRAM but also to a product having data required to be programmed in a non-volatile manner in a circuit integrated on a semiconductor chip, after a wafer-processing and an assembly process complete and before the product is shipped, in order for example to designate a circuit operation.

An address buffer 20 receives row and column address signals through an address signal input terminal group 10. Address buffer 20 responds to address signals A0–An and when it receives a row address it generates a row-related predecode signal RA<0>–RA<i>, wherein i is a natural number. When address buffer 20 receives a column address it generates a predecode signal CA<0>–CA<i>.

A command decode circuit 22 receives a signal from address buffer 20 and a command signal via an external control signal input terminal group 12, such as a row address strobe signal /RAS, a column address strobe signal /CAS, a write enable signal /WE and the like, and outputs an internal control signal int. Comd provided to control an operation of each component of the DRAM. Internal control signal int. Comd, as will be described hereinafter, include a signal for controlling the program circuit, such as signals PG, prmE, Vpgm, NRST and the like.

A clock generation circuit 24 is responsive to a signal received from command decoder circuit 22, to generate a clock signal int. CLK serving as a reference for the operation of each component of DRAM 1000.

Although not shown in the figure, s memory cell array 100 includes a plurality of memory cells arranged in rows and columns, a plurality of word lines provided to correspond to the rows of the memory cells, and a plurality of bit line pairs provided to correspond to the columns of the memory cells to transmit data to the memory cells and read data from the memory cells.

Furthermore, the data of the memory cell read on the bit line pair is amplified by a sense amplifier provided in a sense amplifier band 50.

Memory cell array 100 also includes a spare memory cell row SR and a spare memory cell column SC provided to substitute and thus repair a defective memory cell in a regular memory cell array RMC.

A row decoder 30 receives predecode signal RA<0>–RA<i> from address buffer 20 and generates a word line activation signal and a sense amplifier activation signal. A column decoder 40 provides a logical product of predecode signal CA<0>–CA<i>, a block select signal corresponding to a row-related control signal and a column bank signal to generate a signal VACSL provided to select a column of memory cells (a bit line pair) and also converted in level to an internal power supply level.

A spare row decoder 32 receives predecode signal RA<0>–RA<i> from address buffer 20 and if the signal and a previously programmed defective address match, spare row decoder 32 prohibits a row select operation of row decoder 30 and instead selects a memory cell row in spare memory cell row SR. Similarly, a spare column decoder 42 receives predecode signal CA<0>–CA<i> from address buffer 20 and if the signal and a previously programmed defective address match, it prohibits a column select operation of column decoder 40 and instead select a memory cell column in spare memory cell column SC.

Sense amplifier band 50 accesses a memory cell selected by a word line selected by row decoder 30 and signal VACSL. A signal from the selected memory cell can be read and written externally from and to memory cell array 100 on a global IO line GIO.

A GIO line write driver/read amplifier band 52 drives a level in potential of global IO line GIO to read data transmitted on the global IO line and write data through the global IO line.

Furthermore, GIO line write driver/read amplifier band 52 outputs data read from memory array 100 outside DRAM 1000 via a data input/output circuit 54. Furthermore, GIO line write driver/read amplifier band 52 receives data DQ<0:n> through data input/output terminal group 16 via data input/output circuit 54 and it is driven by data DQ<0:n> to drive a level in potential of line GIO.

DRAM 1000 also includes an internal down-conversion circuit 60 receiving, and down-converting an external power supply voltage ext. Vdd to generate an internal power supply voltage Vcc.

Spare row decoder 32 and spare column decoder 42 include a program circuit, as will be described hereinafter, laser-trimming an LT fuse during a wafer-processing and, after assembly, operative in response to a control signal received from command decoder 22, to program an electrical fuse to allow non-volatile storage of a defective address.

With an LT fuse and an electrical fuse both used, if programming can be effected on a device still in the form of a wafer the LT fuse can be used to program an address and if a defect is introduced after packaging then the electrical fuse can be used to repair the defect. Thus, the LT fuse allows more rapid programming and the electrical fuse allows programming after packaging. This can reduce time and also increase the yield after packaging.

Figure 2:
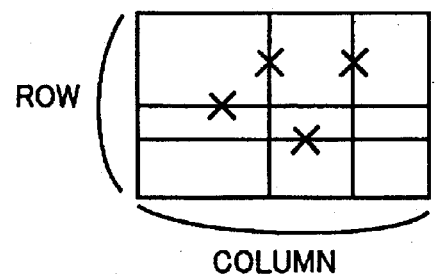
FIG. 2 shows a first concept illustrating a process using both an LT fuse and an electrical fuse to repair a defective memory cell.
Figure 3:
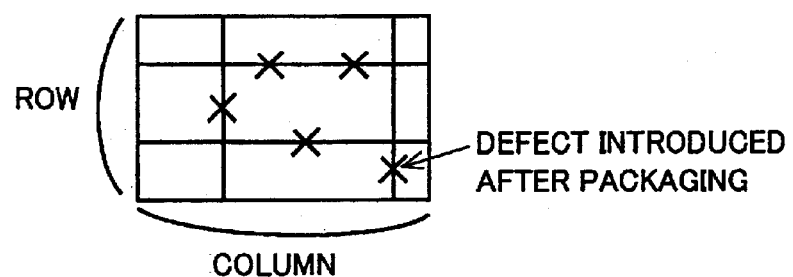
FIG. 3 shows a first concept illustrating a process using both an LT fuse and an electrical fuse to repair a defective memory cell.

FIGS. 2 and 3 show a concept of a process using both an LT fuse and an electrical fuse to repair a defective memory cell.

For example in memory cell array 100 there are provided a spare memory cell row and a spare memory cell column to be capable of repairing two word lines WLs in the direction of a row and two memory cell columns in the direction of a column, for the sake of convenience.

As shown in FIG. 2, based on a test result obtained in processing a wafer an LT fuse is used to effect programming to repair a defective portion by two spare rows and two spare columns.

FIG. 3 shows that after an LT fuse is used to repair a defect and the device is then packaged a defect is introduced in a single memory cell.

Since the spare memory cell rows and columns have already been used for substitution by programming by means of an LT fuse during wafer-processing, the defective memory cell cannot be repaired simply by programming by means of an electrical fuse in addition to that by means of an LT fuse.

However, if a result of programming by the LT fuse can be reset and reprogramming can be effected by an electrical fuse, the defect introduced after packaging can be referred.

FIG. 3 shows that two spare memory cell rows and two spare memory cell columns are used to substitute a defective memory cell if a result of programming by an LT fuse, as shown in FIG. 2, is reset and an electrical fuse is used to reprogram an address to be newly substituted.

In the present programming circuit an LT fuse is used to effect programming and thus repair a defect on a wafer. However, if a defect is introduced after packaging, it may be difficult to repair. Accordingly in the present programming circuit a result of programming by an LT fuse can be reset and an electrical fuse can be used to effect reprogramming.

Figure 4:
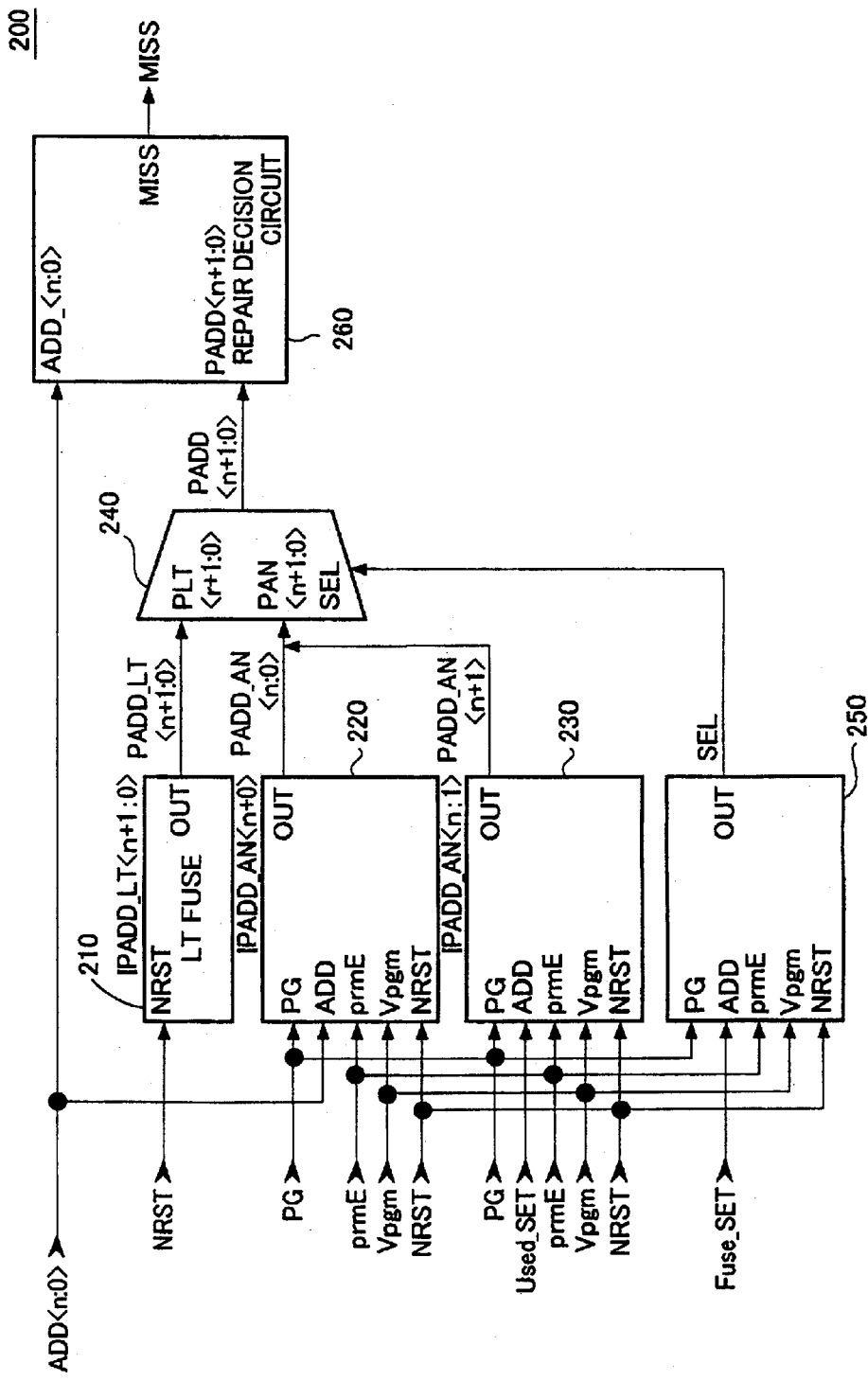
FIG. 4 is a block diagram schematically showing a configuration of a programming circuit 200 capable of reprogramming by means of an electrical fuse after packaging.

FIG. 4 is a block diagram schematically showing a configuration of a programming circuit 200 capable of reprogramming using an electrical fuse after packaging.

Such a programming circuit 200 is provided in spare row decoder 32 and spare column decoder 42.

As shown in FIG. 4, programming circuit 200 includes an LT fuse read circuit 210 programming a defective address when a wafer is being processed, an electrical fuse circuit 220 electrically programming a defective address, an electrical fuse circuit 230 storing therein whether electrical fuse circuit 220 is used, a select circuit 240 receiving data programmed by an LT fuse and that programmed by an electrical fuse, and switching them for output, an electrical fuse circuit 250 designating switching of select circuit 240, and a repair decision circuit 260 comparing an output of select circuit 240 and an input address ADD<n:0> received from address buffer 20.

Herein, input address ADD<n:0> means a predecode signal RA<0>–RA<i> or a predecode signal CA<0>–CA<i>.

Repair decision circuit 260 outputs a signal MISS in response to a result of comparing a program address received from select circuit 240 and input address ADD<n:0>. If the program address and the input address match, repair decision circuit 260 outputs a high level to indicate that redundant memory be used for substitution.

Figure 5:
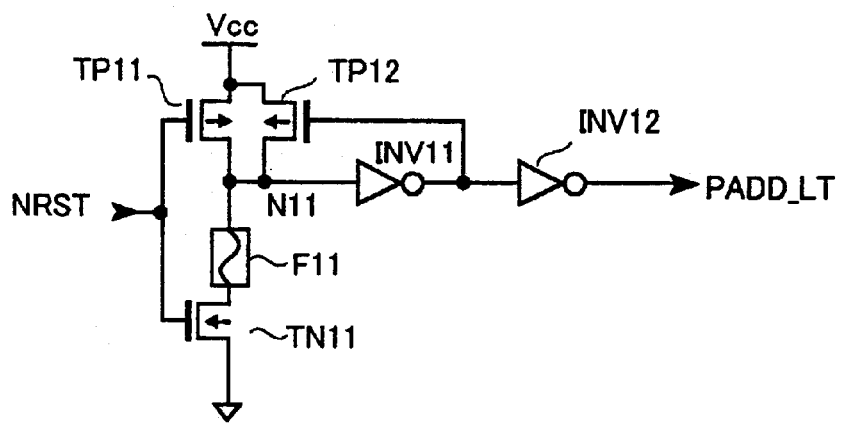
FIG. 5 is a first circuit diagram showing a configuration of a partial read circuit 212.
Figure 6:
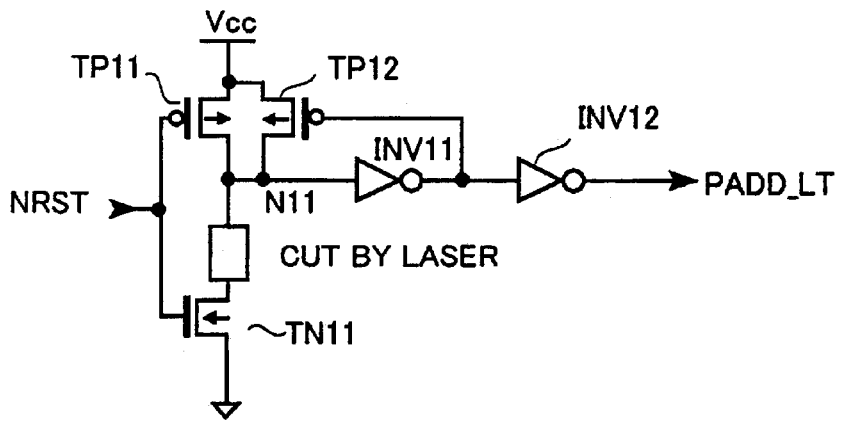
FIG. 6 is a first circuit diagram showing a configuration of a partial read circuit 212.

FIGS. 5 and 6 are a circuit diagram showing a configuration of a partial read circuit 212 corresponding to one bit of a program address in LT fuse read circuit 210.

FIG. 5 shows the circuit without an LT fuse blown and FIG. 6 shows the circuit with an LT fuse blown.

As shown in FIG. 5, partial read circuit 212 includes a P channel MOS transistor TP11, an LT fuse element F11 and an N channel MOS transistor TN11 connected in series between a power supply potential Vcc and a ground potential. Transistors TP11 and TN11 have their respective gates receiving an internal control signal NRST output from command decoder circuit 22.

Partial read circuit 212 also includes a P channel MOS transistor TP12 connected between a node N11 connecting transistor TP11 and LT fuse element F1 together and power supply potential Vcc, an inverter INV11 inverting a level in potential of node N11 for output, an inverter INV12 further inverting an output of inverter INV11 to output a signal PADD_LT. Transistor TP12 has a gate receiving an output of inverter INV11.

Signal PADD_LT represents a single one of the bits of a fuse program address PADD_LT<n+1:0> output from LT fuse read circuit 210.

In FIG. 6, fuse element F11 has been laser-blown and node N11 and transistor TN11 are not electrically connected together.

Figure 7:
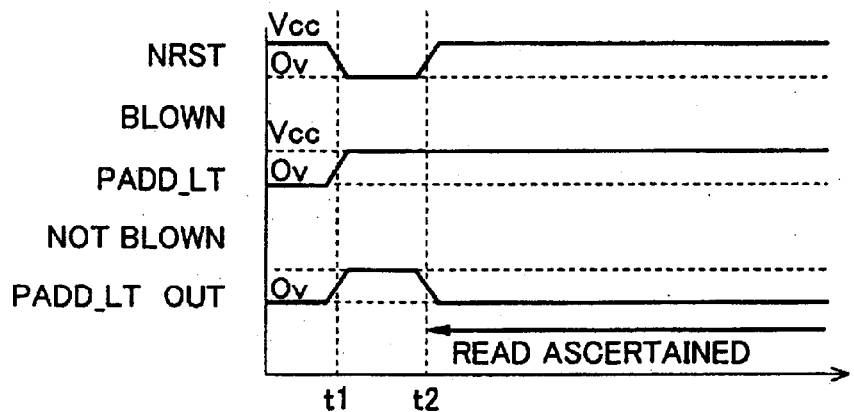
FIG. 7 is a timing plots for illustrating a read process in two states, such as shown in FIGS. 5 and 6.

FIG. 7 is timing plots for illustrating a read operation in such two states as shown in FIGS. 5 and 6.

With reference to FIG. 7, at time t1 signal NRST is set low to initialize the circuit.

Subsequently at time t2 signal NRST is driven high, and if a blow has been effected, signal PADD_LT is held high.

If not then in response to signal NRST going high transistor TN11 turns on and node N11 is discharged, and signal PADD_LT thus attains a low level. These two values can be used to program an address.

Figure 8:
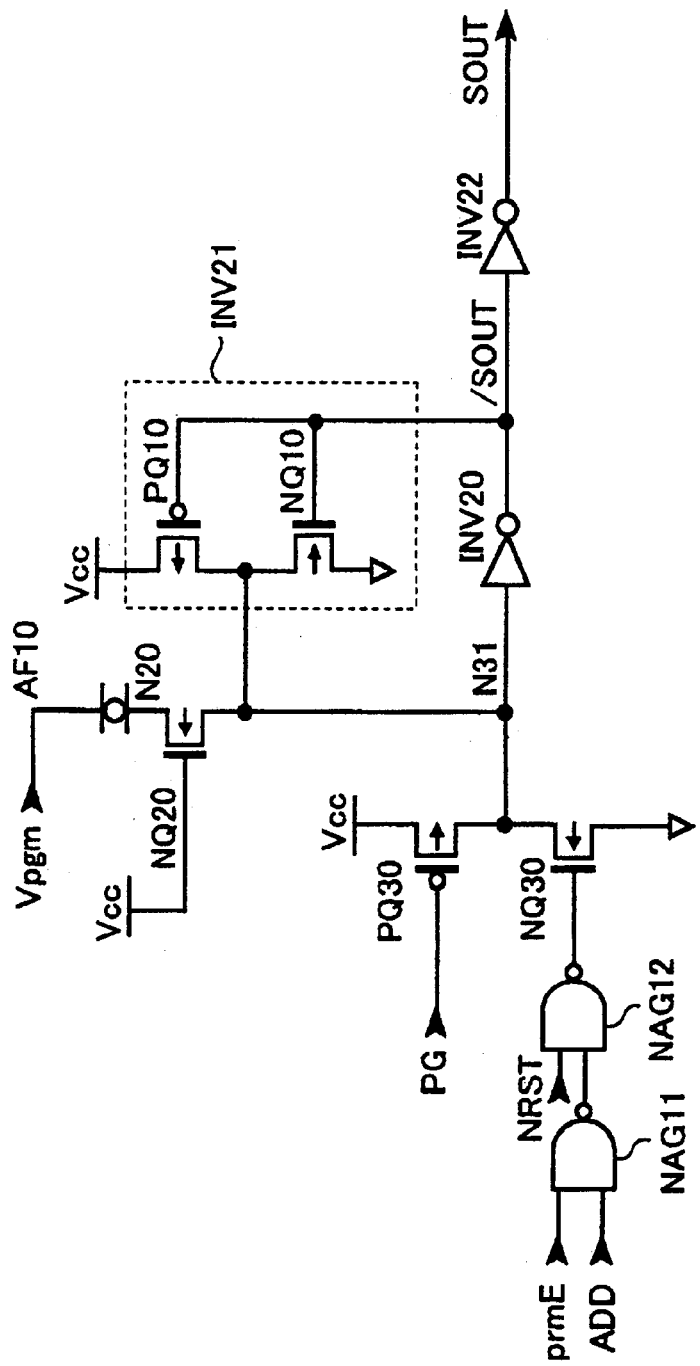
FIG. 8 is a circuit diagram showing a configuration of a partial electrical fuse circuit 300.

FIG. 8 is a circuit diagram showing a configuration of a partial electrical fuse circuit 300.

The FIG. 8 electrical fuse circuit is used in the FIG. 4 electrical fuse circuits 220, 230 and 250.

As shown in FIG. 8, partial electrical fuse circuit 300 includes an NAND circuit NAG11 receiving an internal control signal prmE from command decoder circuit 22 and an address signal ADD from address buffer 22, an NAND circuit NAG 12 receiving an output of NAND circuit NAG11 and internal control signal NRST from command decoder circuit 22, and P and N channel MOS transistors PQ30 and NQ30 connected in series between power supply potential Vcc and a ground potential. Transistor PQ30 has a gate receiving a precharge signal PG from command decoder circuit 22. Transistors PQ30 and NQ30 are connected together by a node N31.

Partial electrical fuse circuit 300 also includes a capacitance element AF11 operating as an anti-fuse element and an N channel MOS transistor NQ20 connected in series between a node receiving program signal Vpgm from command decoder circuit 22 and node N31. Transistor NQ20 has a gate receiving a power supply potential NQ20. Anti-fuse element AF10 and transistor NQ20 are connected together by a node N20.

Herein, program signal Vpgm for example has a level equal to or greater than an external power supply potential ext. Vdd. Such a program signal Vpgm can be applied in a program operation externally through any terminal of control signal input terminal group 12.

Partial electrical fuse circuit 300 also includes an inverter INV20 with internal node N31 and an input node coupled, and an inverter INV21 receiving a signal /SOUT output from inverter INV20. Inverter INV21 includes P and N channel MOS transistors PQ10 and NQ10 coupled in series between power supply potential Vcc and a ground potential. Transistors PQ10 and NQ10 have their respective gates both receiving signal /SOUT. An output node of inverter INV21 is coupled with node N31. Inverters INVs 20 and 21 together form a latch circuit.

Partial electrical fuse circuit 300 also includes an inverter INV22 receiving an output of inverter INV20 and outputting signal SOUT.

If partial electrical fuse circuit 300 is used in electrical fuse circuit 220, signal SOUT represents any single one of 0th to nth bit signals PADD_AN<n:0> of a defective address PADD_AN<n+1:0> programmed by an electrical fuse.

If partial electrical fuse circuit 300 is used in electrical fuse circuit 230, signal SOUT represents an (n+1)th bit signal PADD_AN<n+1> of defective address PADD_AN<n+1:0> programmed by an electrical fuse. Herein, signal PADD_AN<n+1> indicates whether an electrical fuse has been used to effect programming. Signal PADD_AN<n:0> is a signal to be compared with an internal address signal received from address buffer 20.

Figure 9:
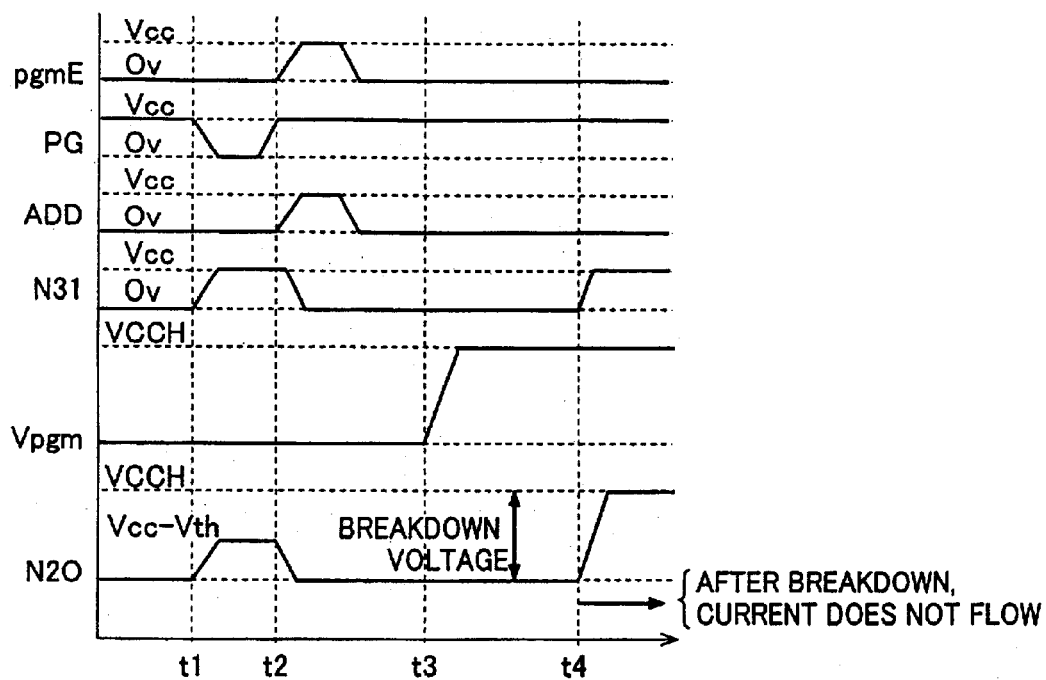
FIG. 9 is first timing plots for illustrating a blow operation of partial electrical fuse circuit 300.
Figure 10:
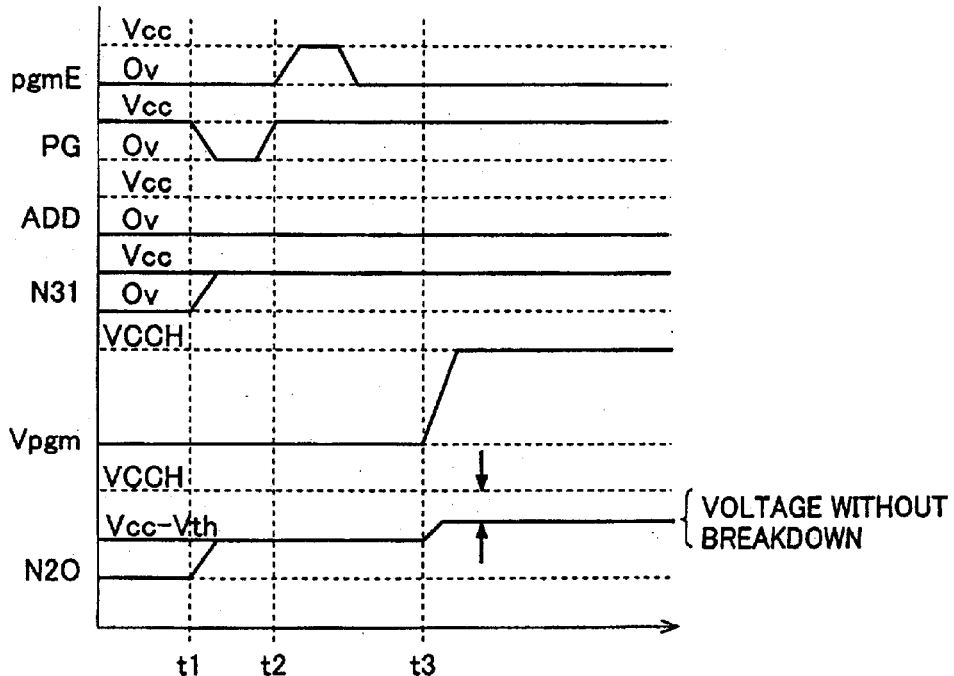
FIG. 10 is second timing plots for illustrating a blow operation of partial electrical fuse circuit 300.

Partial electrical fuse circuit 300 operates, as follows:

FIGS. 9 and 10 are timing plots for illustrating a blow operation of partial electrical fuse circuit 300. FIG. 9 represents a procedure provided when an electrical fuse is blown and FIG. 10 represents that provided when an electrical fuse is not blown.

With reference to FIGS. 9 and 10 a blow operation will initially be described.

At time t1 signal PG is set high to reset a latch circuit of an electrical fuse.

Then at time t2 signal pgmE is drive high to input address signal ADD to be programmed in an electrical fuse.

If address signal ADD has a high level then the latch circuit's node N31 holds a low level.

If address signal ADD has a low level then the latch circuit's node N31 holds a high level.

Then at time t3 a program voltage Vpgm is applied as a high voltage and if node N31 has a low level, as shown in FIG. 9, then an electrical fuse is blown and capacitance is altered to resistance.

In contrast, as shown in FIG. 10, if node N31 has a high level, transistor NQ21 is cut off and an electrical fuse is not loaded and it is thus not blown.

Then, with reference to FIG. 9, at time t4 if an electrical has been blown then from program voltage Vpgm electric current flows and node N31 attains a high level (the voltage Vcc level), when transistor NQ20 is cut off and from then on current is cut.

Figure 11:
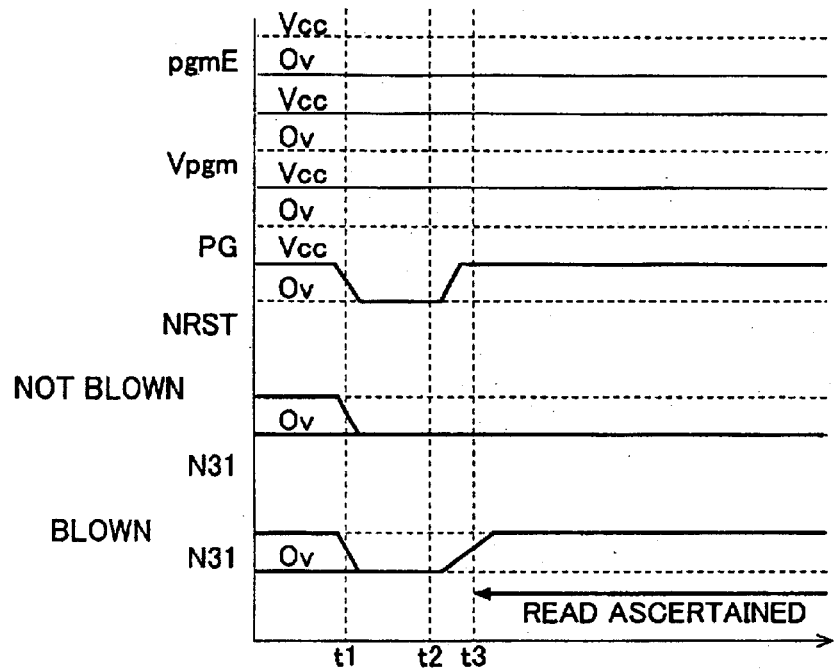
FIG. 11 is timing plots for illustrating a read operation of partial electrical fuse circuit 300.

FIG. 11 is timing plots for illustrating a read operation of partial electrical fuse circuit 300.

At time t1 signal NRST is set low.

Thus node N31 having a low level is latched.

Then at time t2 signal NRST is set high, and if electrical fuse element AF10 is still not blown, node N31 holds a low level.

In contrast, if electrical fuse element AF10 has already been blown, electrical fuse element AF10 has already been altered to a resistor. Thus when at time t2 signal NRST goes high, with program voltage Vpgm having a high level, the node N31 level transition to a high level. In response, at time t3 the latch circuit is inverted and node N31 is fixed high.

Thus two latched results can be compared in repair decision circuit 206 with an input address to determine whether it is an address to be redundantly substituted.

Operation of Electrical Fuse Circuit 250

A description will now be provided of an operation of electrical fuse circuit 250 operative to switch between a decision based on an address programmed by an LT fuse or that based on programming by an electrical fuse.

Normally, electrical fuse circuit 250 outputs a signal SEL of a low level. If after assembly a defective bit is found and electrical fuse circuits 220 and 230 operate to program an address, then in response to a combination of an external control signal and an address signal it effects programming in response to a signal Fuse_SET received from command decoder circuit 22, rather than signals PG, prmE, Vpgm, NRST and address signal ADD output from command decoder circuit 22. Thus, after programming, electrical fuse circuit 250 outputs signal SEL of a high level.

Configuration of Select Circuit 240

Figure 12:
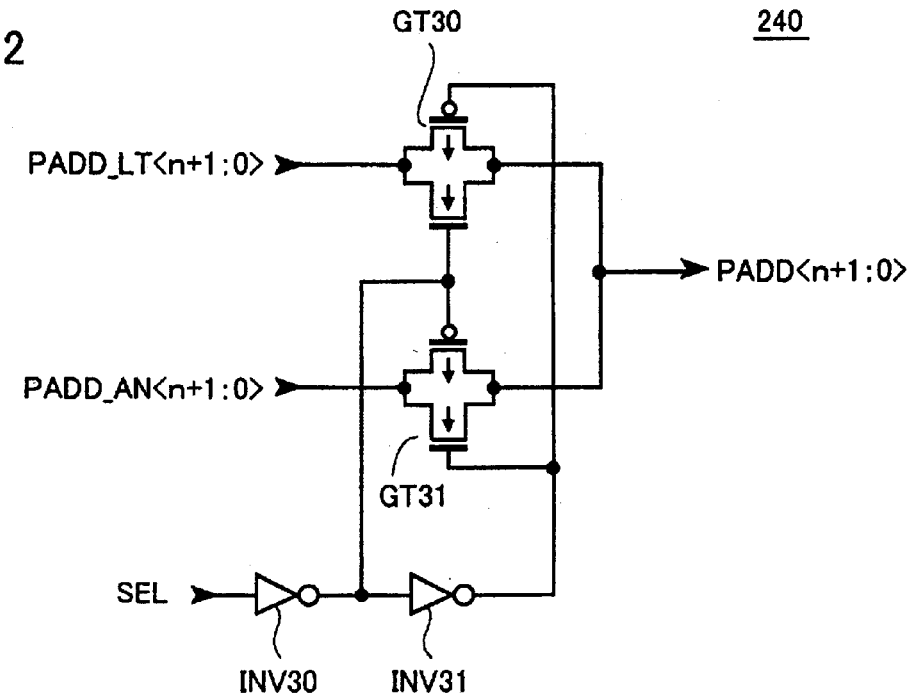
FIG. 12 is a circuit diagram showing a configuration of a select circuit 240.

FIG. 12 is a circuit diagram showing a configuration of select circuit 240.

As shown in FIG. 12, select circuit 240 includes an inverter INV30 receiving signal SEL from electrical fuse circuit 250 for inversion and output, an inverter INV31 receiving an output of inverter INV30 for inversion and output, a gate circuit GT30 receiving program address signal PADD_LT<n+1:0> from LT fuse read circuit 210 and controlled by a signal of inverters INVs 30 and 31 to turn on for signal SEL of a low level from electrical fuse circuit 250 and turn off for signal SEL of a high level therefrom, and a gate circuit GT31 receiving program address signal PADD_AN<n+1:0> from electrical fuse circuits 220 and 230 and controlled by a signal of inverters INVs 30 and 31 to turn on for signal SEL of a high level from electrical fuse circuit 250 and turn off for signal SEL of a low level therefrom.

Gate circuits GTs 30 and 31 output a signal which is in turn input as program address signal PADD<n+1:0> to repair decision circuit 260.

Thus, normally, select circuit 240 outputs an LT fuse-programmed address to repair decision circuit 260 when electrical fuse circuit 250 outputs signal SEL having the high level.

If a defect is introduced after packaging and an address is reprogrammed, however, an electrical fuse of electrical fuse circuit 250 is blown and signal SEL is set high. Thus select circuit 240 is switched to send to repair decision circuit 260 an address programmed by an electrical fuse.

Herein, of program address signal PADD<n+1:0> output from select circuit 240, an (n+1)th bit signal PADD<n+1> is a signal provided to determine whether or not an LT/electrical fuse has been blown to provide redundant substitution. Redundant substitution is not effected without blowing an LT fuse or an electrical fuse corresponding to address signal PADD<n+1>.

FIG. 13 is a circuit diagram for illustrating a configuration of such a repair decision circuit 260.

As shown in FIG. 13, repair decision circuit 260 includes exclusive OR circuits 262.0 to 262.n each having one input receiving a respective one of internal address signals ADD<0> to ADD<n> received from address buffer 20. Exclusive OR circuits 262.0–262.n have their respective other inputs receiving program address signals PADD<0>–PADD<n>(=PADD<n:0>) from select circuit 240 and outputting their respective, exclusive NORs, signals EXNOR<0>–EXNOR<n>.

Repair decision circuit 260 also includes an inverter INV41 receiving program address signal PADD<n+1> from select circuit 240 for inversion, an inverter INV42 inverting an output of inverter INV41, and an AND circuit 264 receiving an output of inverter INV41 and signals EXNOR<0>–EXNOR<n> and outputting a logical product in a signal MISS.

Thus, signal MISS goes high if program address signal PADD<n+1> has a high level and internal address signal ADD<0>–ADD<n> from address buffer 20 and program address signal PADD<0>–PADD<n> from select circuit 240 match, and signal MISS is otherwise driven low.

FIG. 14 represents a correspondence between a result of blowing an LT fuse and a result of a repair.

When an LT fuse is blown, a high level is stored in LT fuse read circuit 210 at partial read circuit 212 corresponding to the blown bit. If an LT fuse is not blown then data of a low level is stored in partial read circuit 212. Thus partial read circuit 212 outputs read data PADD_LT corresponding to the level of the stored data.

By the two states of partial read circuit 212, programmed program address PADD and input address ADD are compared with each other.

As has been described previously, if program address PADD and input address ADD match, signal MISS goes high at a spare memory cell row or column is used to provide a redundant repair. If the addresses do not match, signal the MISS is driven low and redundant repair is not provided, and a row or a column of a regular memory cell array is selected.

FIG. 15 presents a correspondence between a result of blowing an electrical fuse and a result of a repair.

If an electrical fuse is not blown, partial electrical fuse circuit 300 stores low-level data therein. When an electrical fuse is blown, partial electrical fuse circuit 300 stores high-level data therein.

Thus partial electrical fuse circuit 300 outputs read data PADD_AN corresponding to the level of the stored data. The remainder of the operation is similar to that for an LT fuse.

Thus a feature of an electrical fuse, i.e., a repair after packaging can be provided.

Furthermore, an LT fuse can be blown on a wafer rapidly and the device can thus be fabricated in a reduced period of time.

The two features as described above can increase the yield and reduce the fabrication cost.

Furthermore, a result of a repair by means of an LT fuse can be reset and a defect introduced after packaging can be re-repaired by an electrical fuse to provide an increased yield.

Second Embodiment

In the first embodiment an LT fuse and an electrical fuse are arranged in separate circuits. To reduce the circuit scale, however, it is convenient if the electrical fuse and the LT fuse are precharged by a single latch circuit and thus read.

Figure 16:
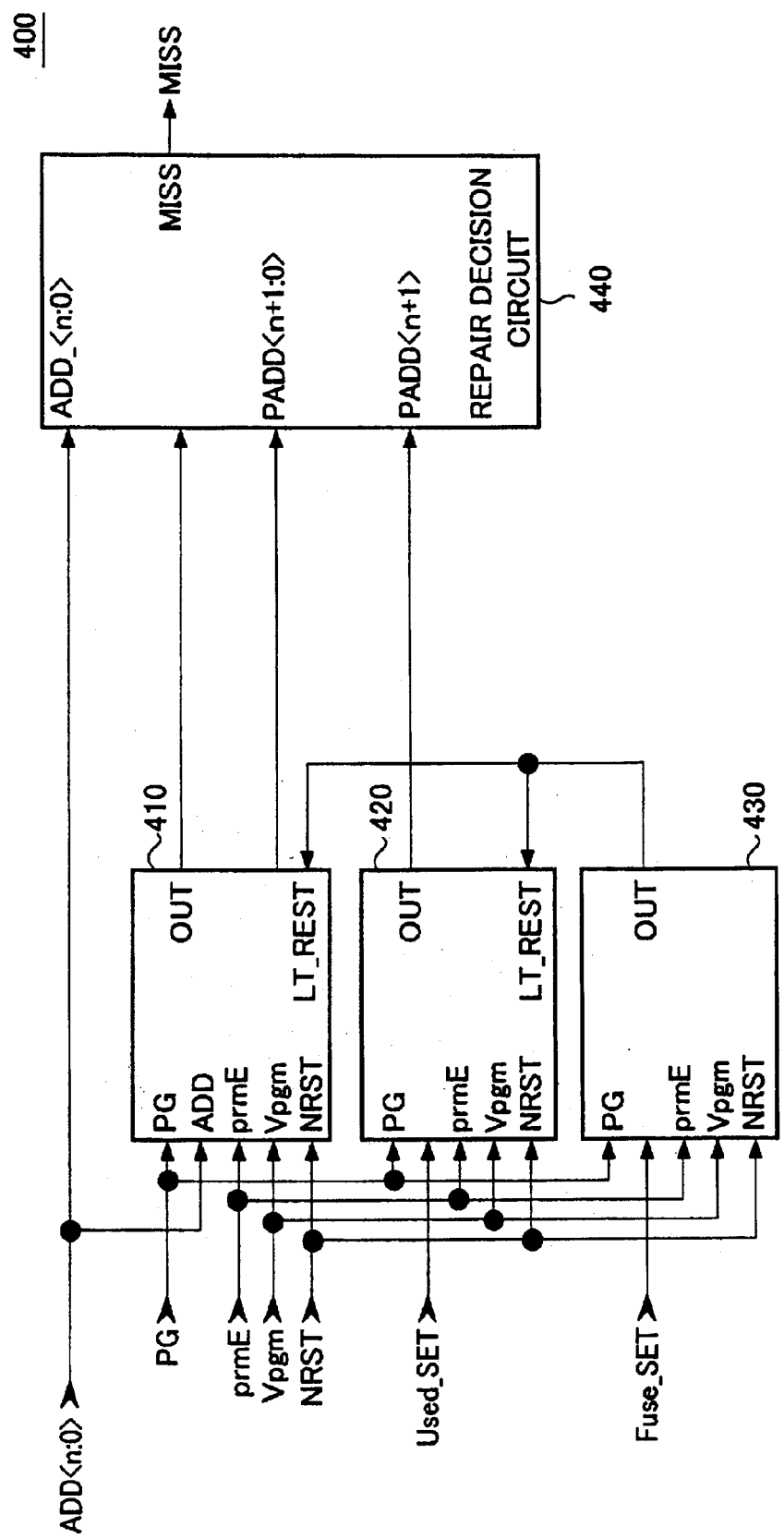
FIG. 16 is a schematic block diagram for illustrating a configuration of a programming circuit 400 of a second embodiment of the present invention.

FIG. 16 is a schematic block diagram for illustrating a configuration of a programming circuit 400 of a second embodiment of the present invention. Programming circuit 400 includes a hybrid fuse circuits 410 and 420, an electrical fuse circuit 430, and a repair decision circuit 440.

As well as in the first embodiment, programming circuit 400 as described above is provided in the FIG. 1 DRAM 1000 at spare row and column decoders 32 and 42.

Hybrid fuse circuit 410, as will be described hereinafter, is a circuit having a combination of the function of LT fuse read circuit 210 and that of electrical fuse circuit 220 described in the first embodiment with reference to FIG. 4.

Hybrid fuse circuit 420 stores therein whether or not fuse circuit 310 is used.

Electrical fuse circuit 430, as will be described hereinafter, stores the level of a signal LT_RESET provided to control a discharge transistor in hybrid fuse circuits 410 and 420 with an LT fuse connected thereto. To store the level of signal LT_RESET, electrical fuse circuit 430 is provided with partial electrical fuse circuit 300 described in the first embodiment with reference to FIG. 8.

Herein, input address ADD<n:0> also represents predecode signal RA<0>–RA<i> or CA<0>–CA<i> received from address buffer 20.

Repair decision circuit 440 outputs signal MISS in response to a result of comparing a program address received from hybrid fuse circuit 410 and input address ADD<n:0>. If the program address and the input address match, repair decision circuit 440 outputs a high level to indicate that redundant memory be used for substitution.

Figure 17:
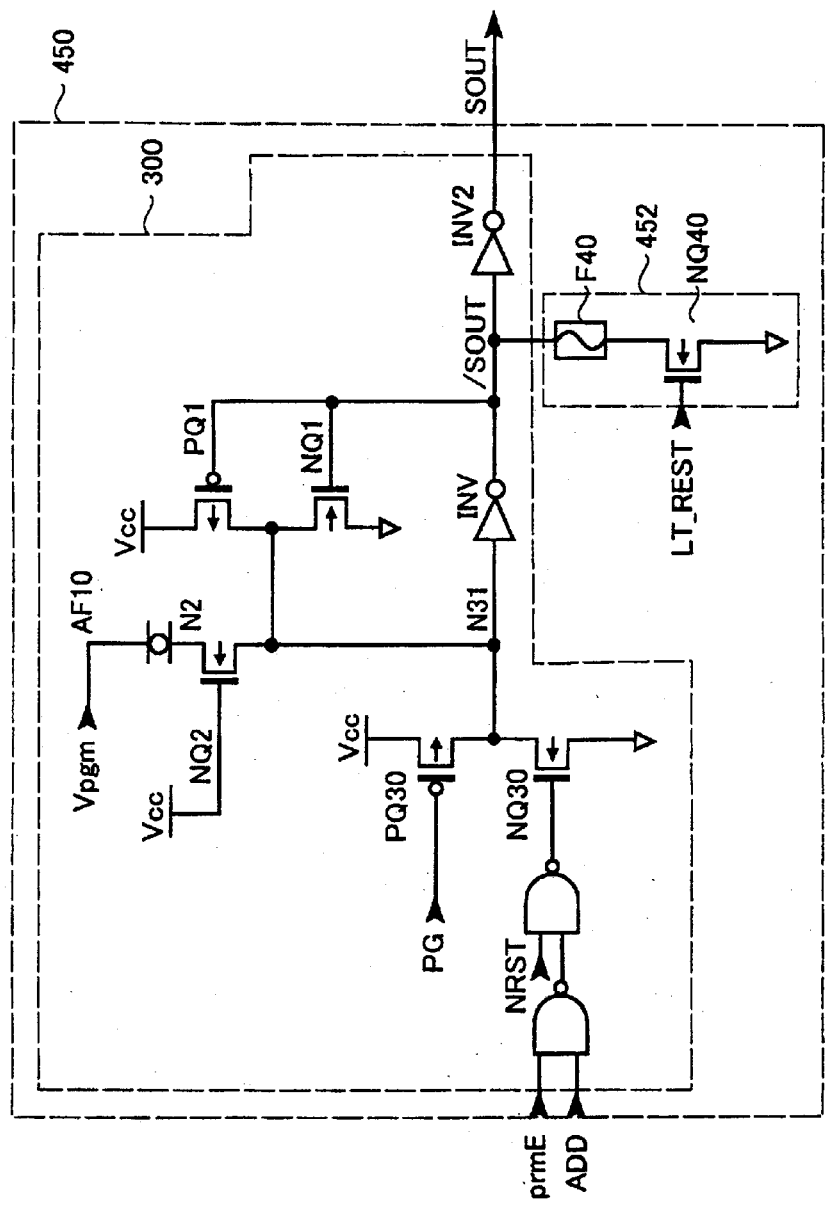
FIG. 17 is a circuit diagram showing a configuration of a partial fuse circuit 450 provided in a hybrid fuse circuit 410 or 420.

FIG. 17 is a circuit diagram showing a configuration of partial fuse circuit 450 provided in hybrid fuse circuit 410 or 420.

The FIG. 17 partial fuse circuit 450 includes partial electrical fuse circuit 300 described in the first embodiment with reference to FIG. 8 plus an LT fuse circuit 452 connected to an output node of inverter INV20.

LT fuse circuit 452 includes an N channel MOS transistor NQ40 and an LT fuse element F40 connected in series between the output node of inverter INV20 and a ground potential. N channel MOS transistor NQ40 has a gate receiving a signal LT_REST.

Partial electrical fuse circuit 300 operates, as has been described in the first embodiment.

If partial fuse circuit 450 is used in hybrid fuse circuit 410, signal SOUT represents any 1-bit signal of 0th to nth-bit signal PADD<n:0> of a defective address PADD<n+1:0> programmed by LT fuse F40 or electrical fuse AF10.

If partial fuse circuit 450 is used in hybrid fuse circuit 420, signal SOUT represents an (n+1)th bit signal PADD<n+1> of defective address PADD<n+1:0> programmed by LT fuse F40 or electrical fuse AF10. Herein, signal PADD<n+1> indicates whether LT/electrical fuse F40/AF10 have been used to program an address.

FIG. 18 is timing plots for illustrating a read operation of partial fuse circuit 450.

Hereinafter will be described an operation provided when LT fuse is used. In this operation, signal LT_REST is set high.

Then at time t1 signal NRST is set low to initialize a latch circuit, when node N31 has a low level.

Then at time t2 signal NRST is driven high, and if LT fuse F40 has already been blown, node N31 is held low.

If the LT fuse is not blown, LT fuse F40 conducts and at time t2 and thereafter signal /SOUT thus has a low level and node N31 is held high.

As has been described above, electrical fuse circuit 430 is operative to switch to allow an address programmed by electrical fuse AF10 to be used instead of an address programmed by LT fuse F40. If an address programmed by electrical fuse AF10 is used, signal LT_REST is set low.

Hybrid fuse circuit 420 is a program circuit operative in response to a signal Used_set received from command decoder circuit 22 to store therein whether a set of LT fuses and that of electrical fuses have been used. The circuit outputs PADD<n+1> switching in response to signal LT_REST and constantly held low if neither an LT fuse nor an electrical fuse are used.

FIGS. 19 and 20 present a correspondence between a result of blowing a fuse and a result of a repair.

FIG. 19 represents a correspondence of a result of a repair when LT fuse F40 is used.

Initially, with reference to FIG. 19, when LT fuse F40 is blown, low-level data is stored as the level of node N31. If LT fuse F40 is not blown, then high-level data is stored as the level of node N31.

Repair decision circuit 440 compares program address signal PADD an input address ADD output in response to these two states.

FIG. 20 represents a correspondence of a result of a repair when LT fuse F40 is not used and electrical fuse AF10 is instead used.

If electrical fuse AF10 is not blown, low-level data is stored as the level of node N31, and if electrical fuse AF10 is blown then high-level data is stored as the level of node N31.

Thus in addition to the effect of the first embodiment an LT fuse and an electrical fuse can share a single precharge circuit to reduce the number of circuit components.

Third Embodiment

Figure 21:
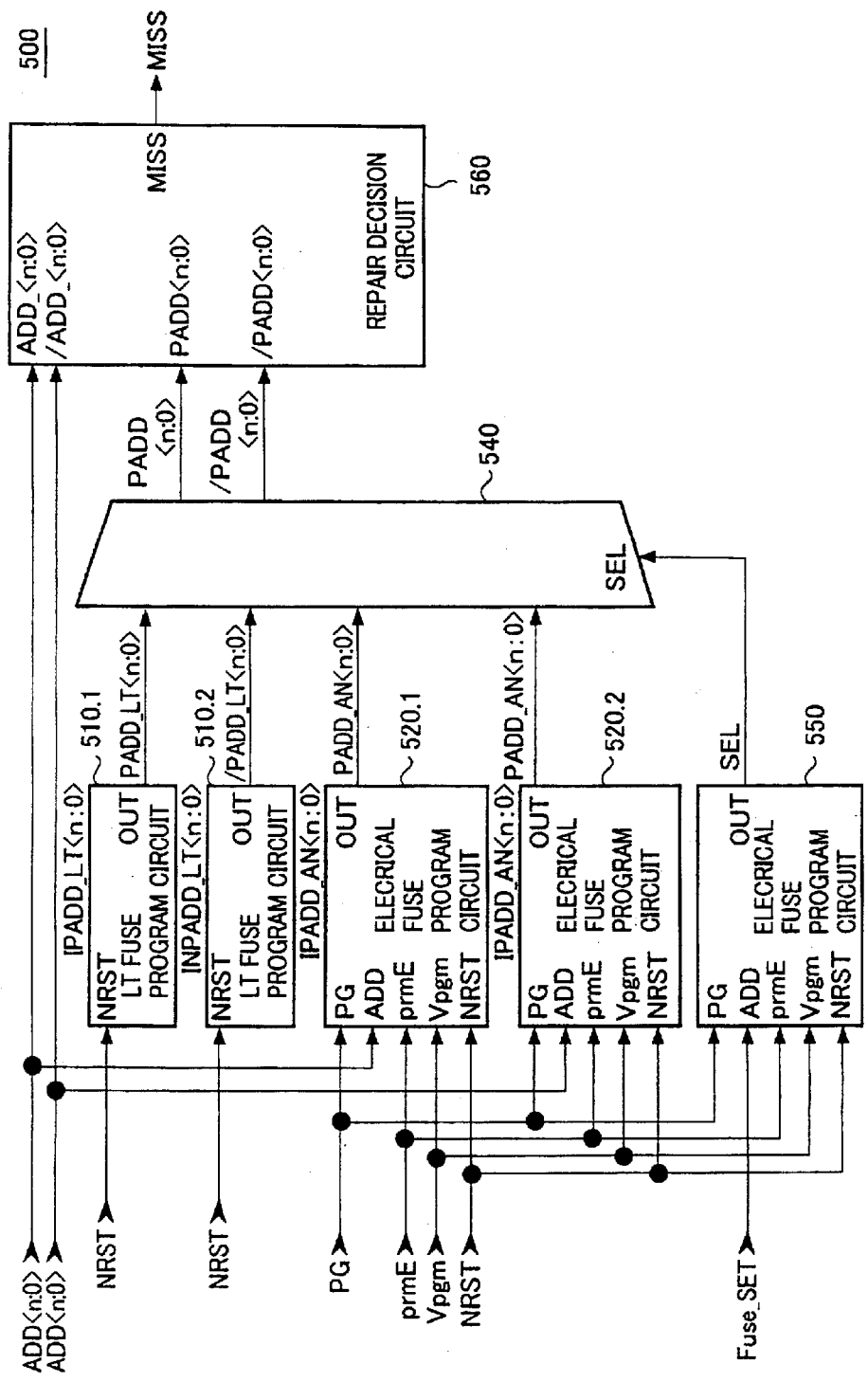
FIG. 21 is a schematic block diagram showing a configuration of a program circuit 500 of a third embodiment of the present invention.

FIG. 21 is a schematic block diagram showing a configuration of a program circuit 500 of a third embodiment of the present invention.

As well as in the first embodiment, programming circuit 500 is provided in the FIG. 1 DRAM 1000 at spare and row column decoders 32 and 42.

Note however that in the third embodiment, programming circuit 500 operates receiving from address buffer 20 complementary internal row address signals RA<0>–RA<n> and /RA<0>–/RA<n> and complementary internal column address signals CA<0>–CA<n> and /CA<0>–CA<n> output as a result of predecoding, wherein n represents a natural number.

In FIG. 21, internal row address signals RA<0>–RA<n> and /RA<0>–/RA<n> or internal column address signals CA<0>–CA<n> and /CA<0>–/CA<n> will generally be referred to as internal address signals ADD<n:0> and /ADD<n:0>. Furthermore in programming circuit 500 program address PADD<n:0> and /PADD<n:0> will also similarly, as will be described hereinafter, be programmed by an LT fuse or an electrical fuse.

As shown in FIG. 21, programming circuit 500 includes an LT fuse read circuit 510.1 programming a defective address PADD<n:0>_LT while a wafer is being processed, an LT fuse read circuit 510.2 programming defective address /PADD<n:0>_LT while a wafer is being processed, an electrical fuse circuit 520.1 electrically programming a defective address PADD<n:0>_AN, an electrical fuse circuit 520.2 electrically programming a defective address /PADD<n:0>_AN, a select circuit 540 receiving and switching data programmed by an LT fuse and that programmed by an electrical fuse, to output program address PADD<n:0> and /PADD<n:0>, an electrical fuse circuit 550 designating switching of select circuit 540, and a repair decision circuit 560 comparing an output of select circuit 540 and input address ADD<n:0> and /ADD<n:0> received from address buffer 20.

Repair decision circuit 560 outputs signal MISS in response to a result of comparing program address PADD<n:0> and /PADD<n:0> received from select circuit 540 and input address ADD<n:0> and /ADD<n:0>. If the program address and the input address match, repair decision circuit 560 outputs a high level to indicate that redundant memory be used for substitution.

Thus in program circuit 500 predecoded address signal ADD<n:0>, /ADD<n:0> can be used and a program circuit storing therein whether a fuse has been used to program an address, such as electrical fuse circuit 230 of the first embodiment, can thus be dispensed with.

Figure 22:
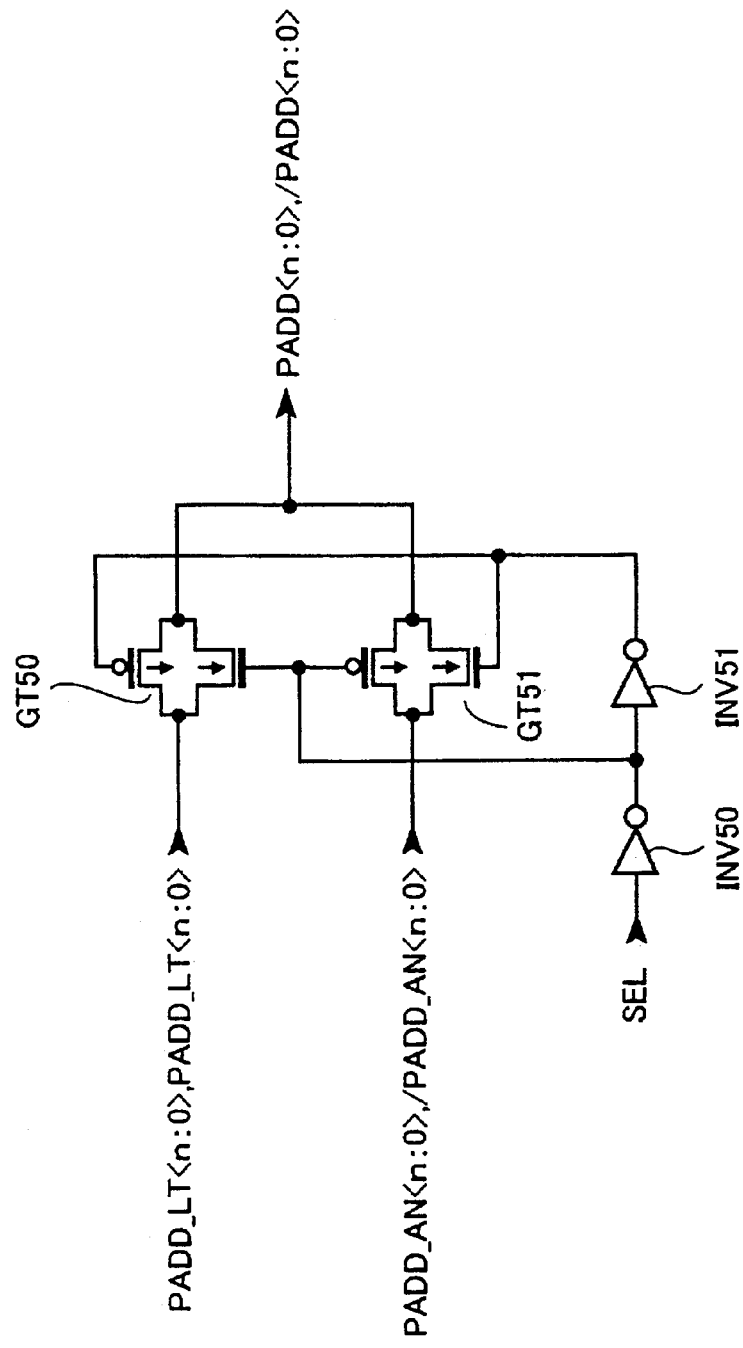
FIG. 22 is a circuit diagram showing a configuration of a select circuit 540.

FIG. 22 is a circuit diagram showing a configuration of select circuit 540.

As shown in FIG. 22, select circuit 540 includes an inverter INV50 receiving signal SEL from electrical fuse circuit 550 for inversion and output, an inverter INV51 receiving an output of inverter INV50 for inversion and output, a gate circuit GT50 receiving program address signal PADD_LT<n:0> and /PADD_LT<n:0> from LT fuse read circuits 510.1 and 510.2 and controlled by a signal of inverters INVs 50 and 51 to turn on for signal SEL of a low level received from electrical fuse circuit 550 and turn off for signal SEL of a high level received therefrom, and a gate circuit GT51 receiving program address signal PADD_AN<n:0> and /PADD_AN<n:0> from electrical fuse circuits 520.1 and 520.2 and controlled by a signal of inverters INVs 50 and 51 to turn on for signal SEL of a high level received from electrical fuse circuit 550 and turn off for signal SEL of a low level received therefrom.

Gate circuits GTs 50 and 51 output a signal which is in turn input as program address signal PADD<n:0> and /PADD<n:0> to repair decision circuit 560.

Figure 23:
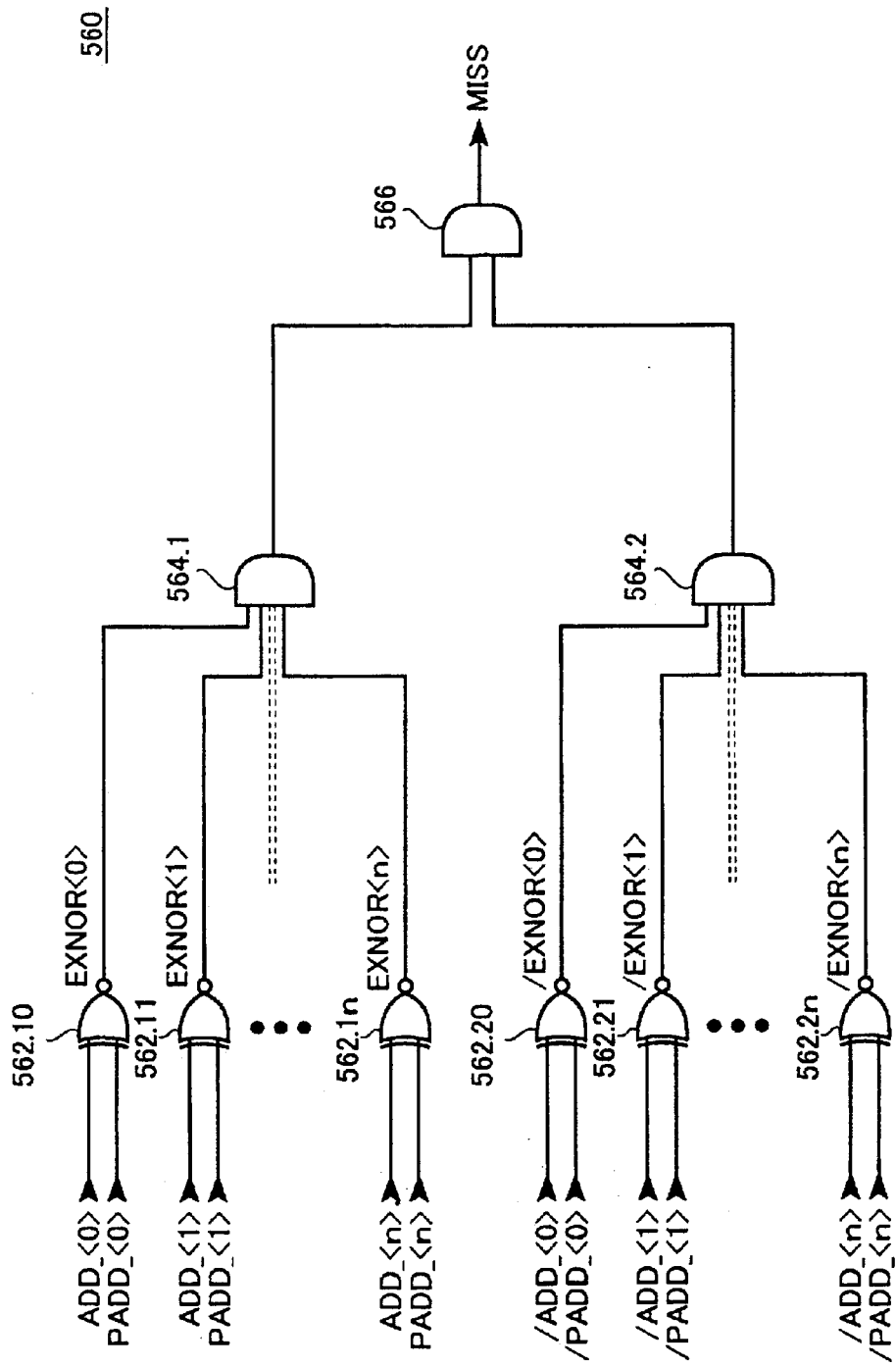
FIG. 23 is a circuit diagram for illustrating a configuration of a repair decision circuit 560.

FIG. 23 is a circuit diagram for illustrating a configuration of repair decision circuit 560.

As shown in FIG. 23, repair decision circuit 560 includes exclusive OR circuits 262.10–262.2$n$ each having one input receiving a respective one of internal address signals ADD<0> to ADD<n> (=ADD<n:0>) from address buffer 20, and exclusive OR circuits 262.20–262.2$n$ each having one input receiving a respective one of internal address signals /ADD<0>–/ADD<n> (=/ADD<n:0>) from address buffer 20.

Exclusive OR circuits 262.10–262.1$n$ in have their respective other inputs receiving program address signal PADD<0>–PADD<n> (=PADD<n:0>) received from select circuit 540 and output their respective exclusive NORs, i.e., signals EXNOR<0>–EXNOR<n>.

In contrast, exclusive OR circuits 262.20–262.2$n$ have their respective other inputs receiving program address signal /PADD<0>–/PADD<n> (=/PADD<n:0>) from select circuit 540 and output their respective exclusive NORS, i.e., signals /EXNOR<0>–/EXNOR<n>.

Repair decision circuit 260 also includes an AND circuit 564.1 receiving signal EXNOR<0>–EXNOR<n> and outputting a logical product, an AND circuit 564.2 receiving signal /EXNOR<0>–/EXNOR<n> and outputting a logical product, and an AND circuit 566 receiving outputs of AND circuits 564.1 and 564.2 and outputting a logical product in signal MISS.

Thus signal MISS goes high when internal address signal ADD<n:0> and /ADD<n:0> and program address PADD<n:0> and /PADD<n:0> match, and signal MISS is otherwise driven low.

The configuration as described above can also be as effective as program circuit 200 described in the first embodiment.

Fourth Embodiment

Figure 24:
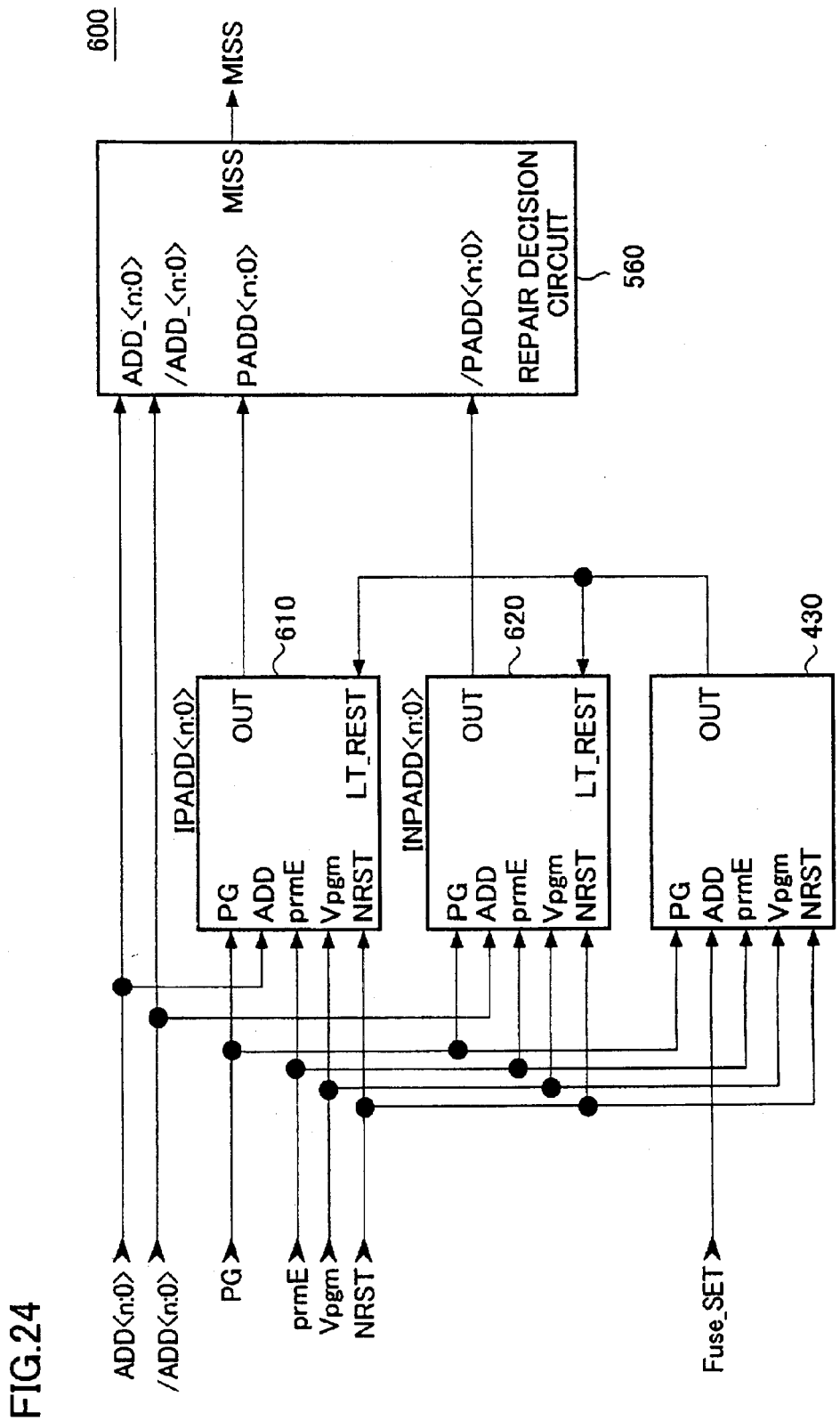
FIG. 24 is a schematic block diagram for illustrating a configuration of a program circuit 600 of a fourth embodiment of the present invention.

FIG. 24 is a schematic block diagram for illustrating a configuration of a program circuit 600 of a fourth embodiment of the present invention.

Program circuit 600 of the fourth embodiment, as well as program circuit 500 of the third embodiment, operates receiving from address buffer 20 complementarily internal row address signal RA<0>–RA<n> and /RA<0>–/RA<n> and complementary internal column address signals CA<0>–CA<n> and /CA<0>–/CA<n> output as a result of predecoding, wherein n represents a natural number.

Note however that program circuit 600 of the fourth embodiment, as well as program circuit 400 described in the second embodiment with reference to FIG. 16, uses an LT fuse and an electrical fuse sharing a single precharge circuit to store program address signal PADD_AN<n:0> and /PADD AN<n:0>.

That is, program circuit 600 includes a hybrid fuse circuit 610, a hybrid fuse circuit 620, an internal fuse circuit 430 and a repair decision circuit 560.

Hybrid fuse circuits 610 and 620 correspond to hybrid fuse circuits 410 and 420 plus a number of partial fuse circuits 450 that allows storage of complementary internal address signals. Furthermore, electrical fuse circuit 430 is configured as described in the second embodiment and repair decision circuit 560 is configured as described in the third embodiment.

Such a configuration as above can reduce the number of circuit components and also be as effective as program circuit 500 of the third embodiment.

Fifth Embodiment

Figure 25:
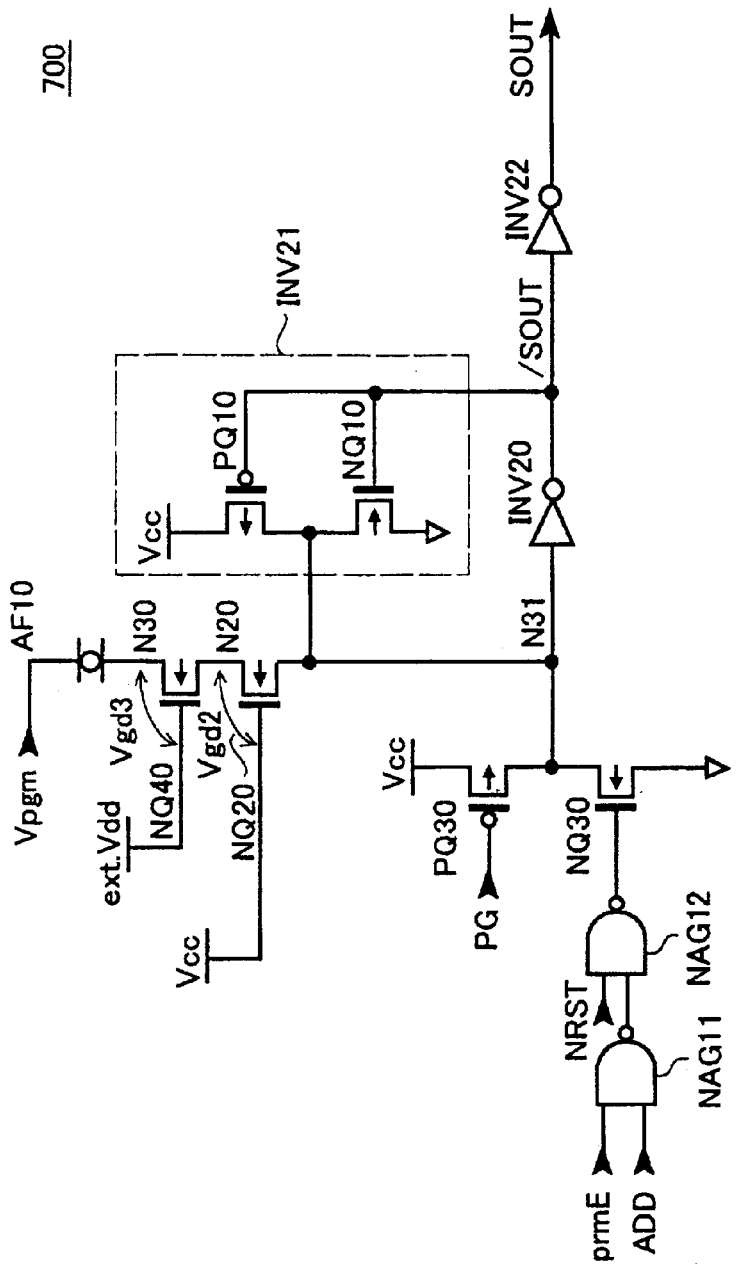
FIG. 25 is a circuit diagram showing a configuration of a partial electrical fuse circuit 700 of a fifth embodiment of the present invention.

FIG. 25 is a circuit diagram showing a configuration of a partial electrical fuse circuit 700 of a fifth embodiment of the present invention. Partial electrical fuse circuit 700 can be used in place of the FIG. 8 partial electrical fuse circuit 300.

Partial electrical fuse circuit 700 differs in configuration from partial electrical fuse circuit 300 in that transistor NQ40 is connected between node N20 and electrical fuse AF10. Transistor NQ40 has a gate receiving external power supply voltage ext. Vdd higher than internal power supply voltage Vcc.

In other words, electrical fuse AF10 is connected between node N30 connecting electrical fuse AF10 and transistor NQ40 together and a node receiving program voltage Vpgm.

Figure 26:
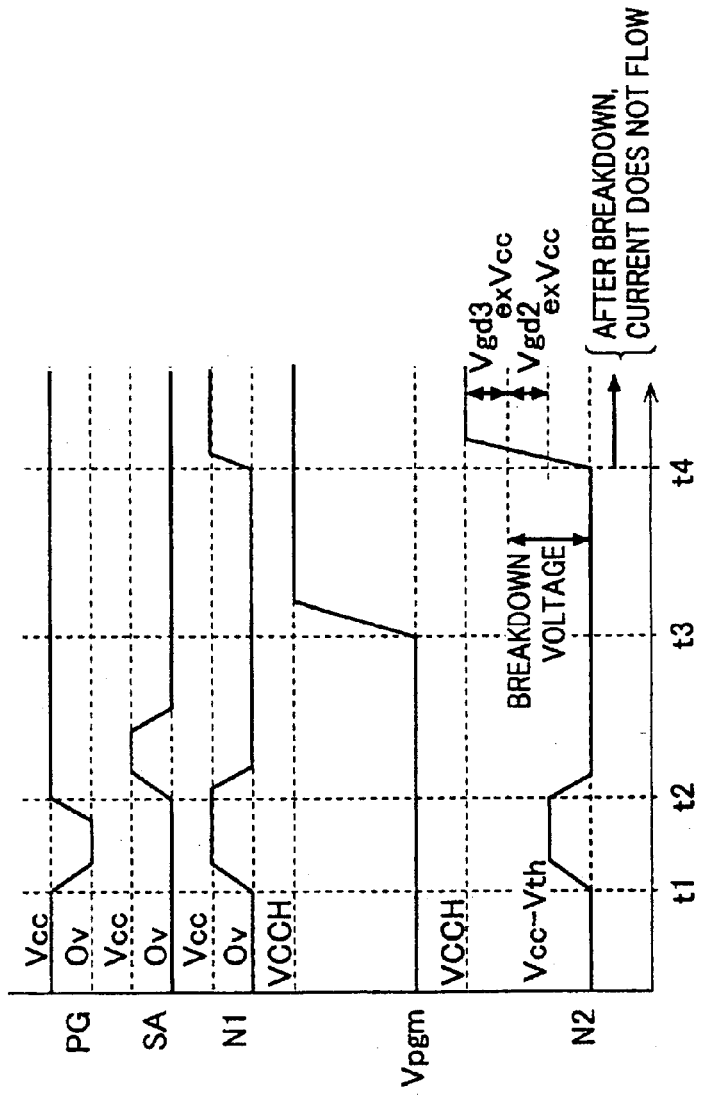
FIG. 26 is timing plots for illustrating a blow operation of partial electrical fuse circuit 700.

FIG. 26 is timing plots for illustrating a blow operation of the FIG. 25 partial electrical fuse circuit 700.

At time t1 signal PG is set low and transistor PQ30 is turned on. Thus a latch circuit formed by inverters INVs 20 and 21 is initialized, and node N31 attains a high level.

Then at time t2 signal PG is set low and subsequently signal SA output from NAND circuit NAG12 is set high. In response, the latch circuit' node N31 holds a low level. When holding a level to the latch circuit completes, signal SA is driven low.

Subsequently at time t3 program voltage Vpgm is input in high voltage VCCH. Since node N31 has a low level, transistors NQ20 and NQ40 thus turn on and nodes N20 and N30 attain a low level. Thus, a potential difference of program voltage Vpgm is introduced between opposite ends of electrical fuse element AF10.

Then, electrical fuse element AF10 with a high voltage applied thereto, receiving high potential VCCH higher than a breakdown voltage, breaks down and thus short-circuits.

At time t4 a short-circuit occurs and responsively node N13 gradually transitions to a high level and when it exceeds a logical threshold value of inverter INV20 the level held by the latch circuit is inverted.

When the level held by the latch circuit is inverted and node N31 attains a high level, the transistor NQ20 gate and node N31 attain an equipotential and transistor NQ20 thus has a gate-source voltage of 0V and NQ20 is thus cut off.

As well as transistor NQ20, transistor NQ40 has a gate-source voltage of 0V when node N20 attains external power supply voltage ext. Vdd, and transistor NQ40 is thus cut off.

Transistors NQ20 and NQ40 both cut off prevent electrical current from flowing from a node receiving program voltage Vpgm toward ground after electrical fuse AF10 has been blown.

At that time, transistor NQ40 has a gate-drain voltage Vgd3 of Vpgm minus ext. Vdd.

Meanwhile transistor NQ20 has a gate-drain voltage Vgd2 of ext. Vdd minus Vcc, divided.

Furthermore, to invert a level held by the latch circuit or a level of node N31, electrical fuse AF10 needs to have an ON resistance, (a resistance in short-circuit condition) of approximately the same level as that of transistor NQ10. If a fuse blow operation can be continued until inversion of a level held by the latch circuit is confirmed, resistance can be controlled in blowing a fuse to improve quality.

Furthermore, inserting transistors NQ20 and NQ40 between nodes N30 and N31 can distribute voltage applied to a gate oxide film of transistor NQ20, as compared with the FIG. 8 partial electrical fuse circuit 300, to apply higher program voltage Vpgm to provide a reliable blow operation.

Sixth Embodiment

Figure 27:
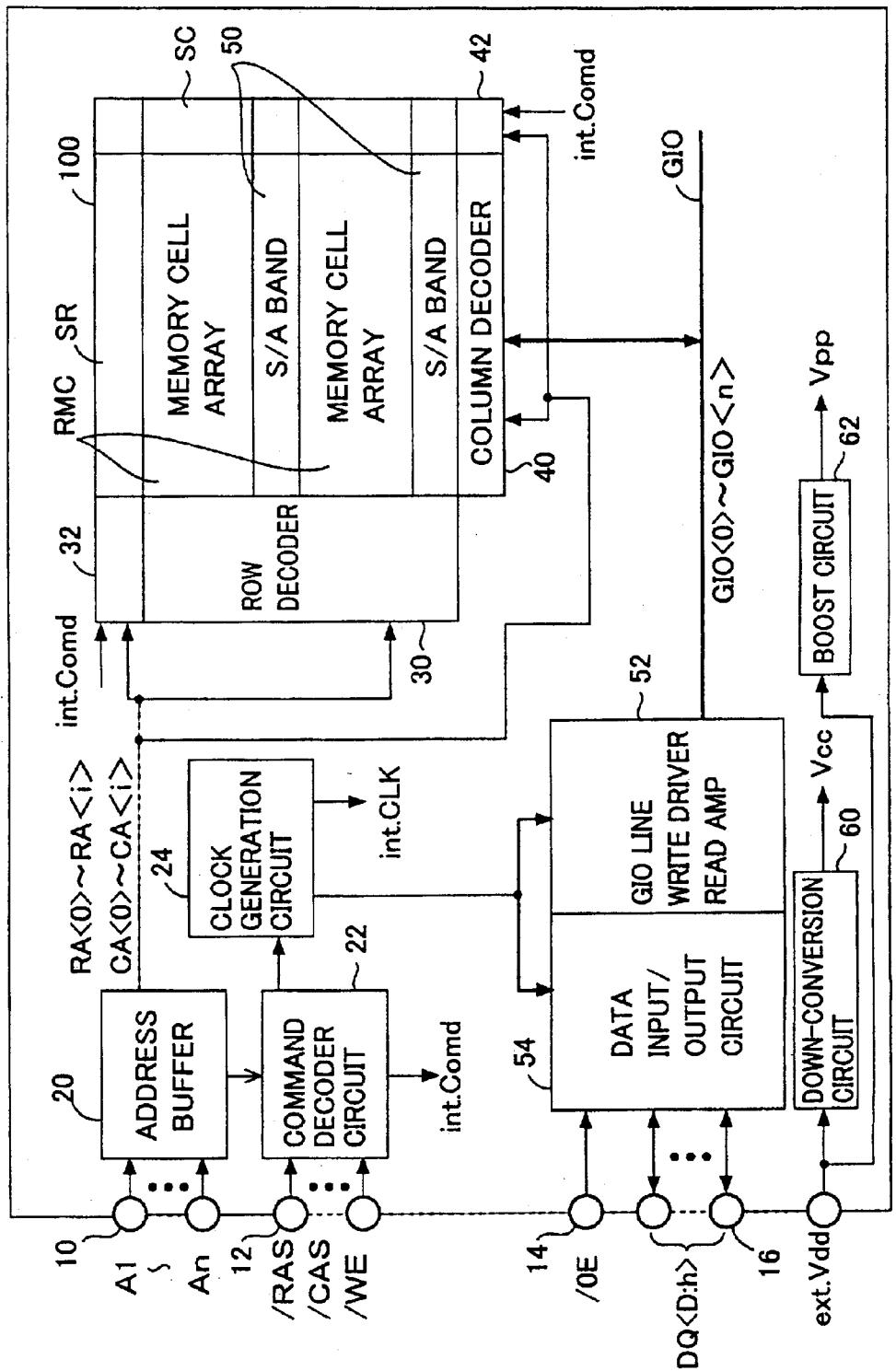
FIG. 27 is a schematic block diagram for illustrating a configuration of a DRAM 1100 of a sixth embodiment of the present invention.

FIG. 27 is a schematic block diagram for illustrating a configuration of a DRAM 1100 of a sixth embodiment of the present invention. DRAM 1100 differs in configuration from DRAM 1000 described in the first embodiment with reference to FIG. 1 in that the former is provided with a boost circuit 62 receiving external power supply potential ext. Vdd to generate a boosted potential Vpp. The remainder of the configuration is similar to that of DRAM 1000, with like components labeled like reference characters.

Figure 28:
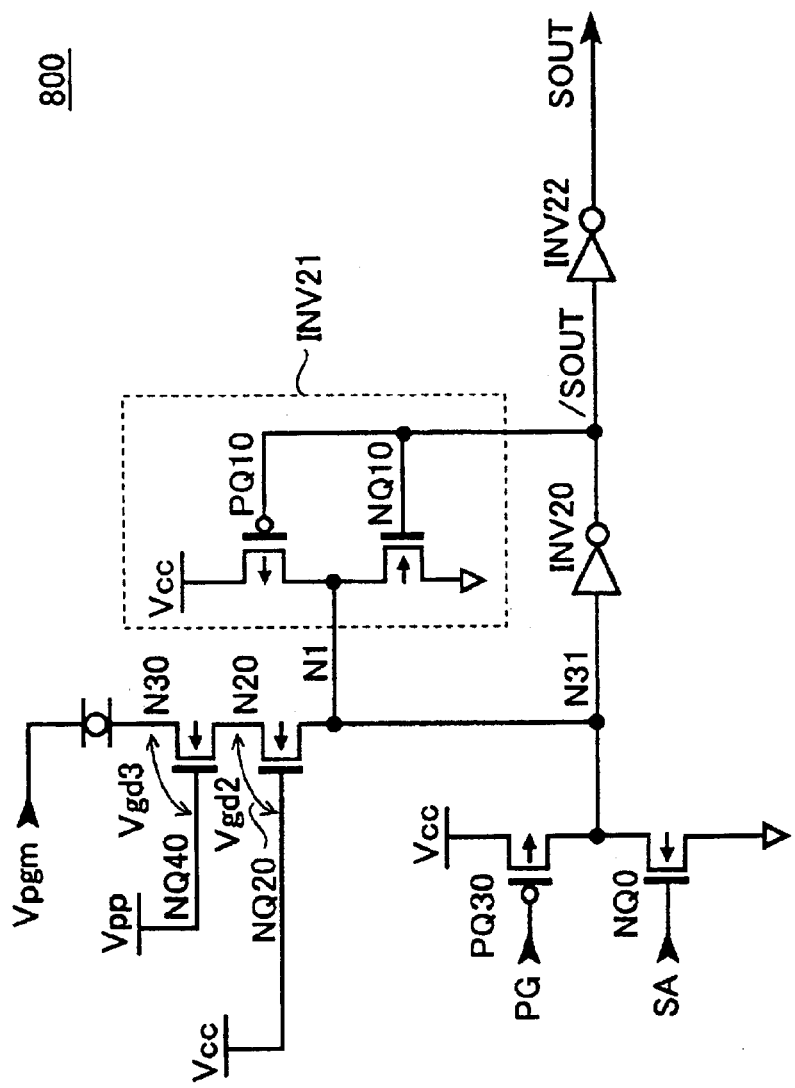
FIG. 28 is a circuit diagram showing a configuration of a partial electrical fuse circuit 800 of the sixth embodiment.
Figure 29:
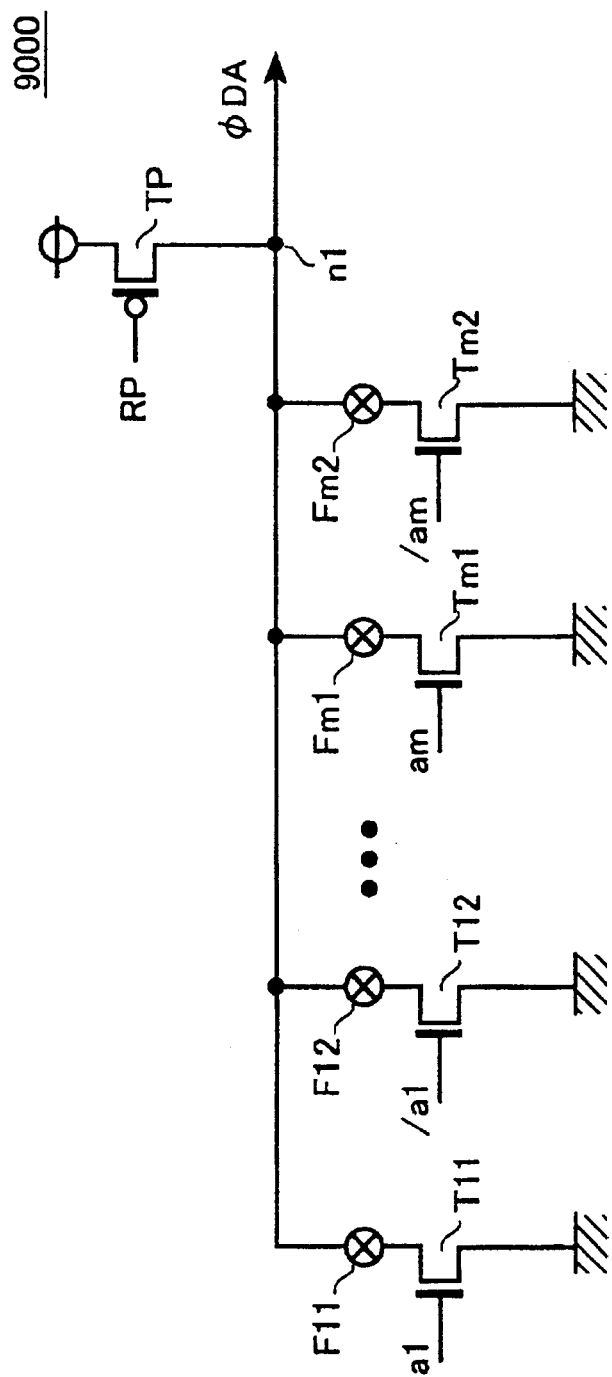
FIG. 29 is a circuit diagram for illustrating a configuration of a conventional fuse bank-address detection circuit 9000.
Figure 30:
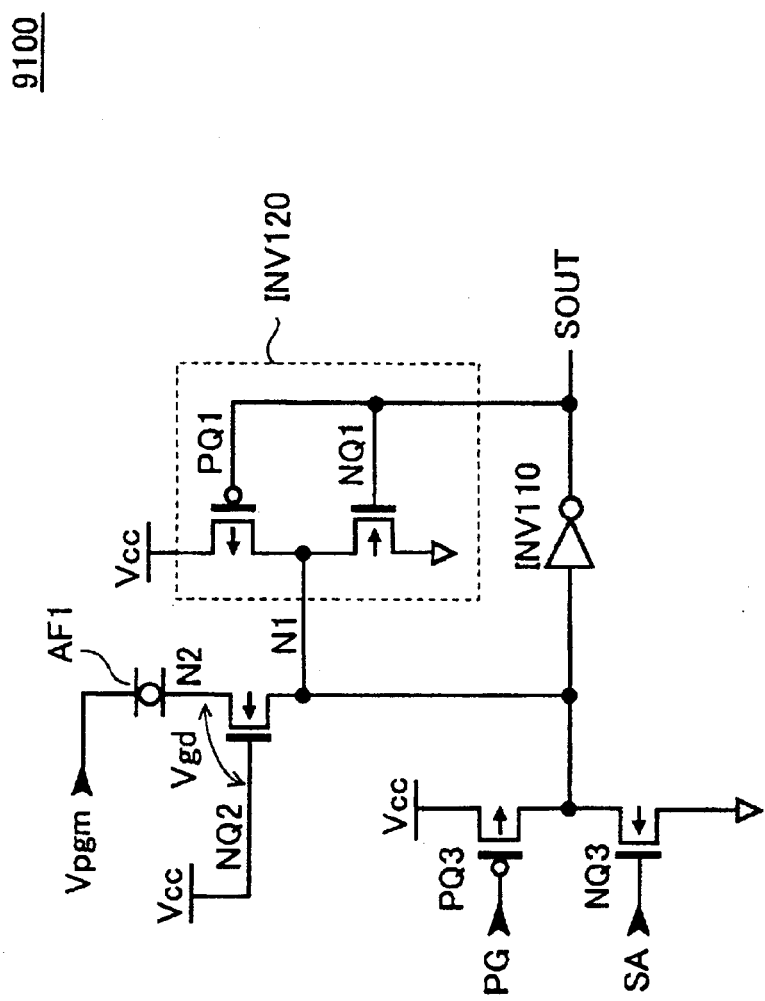
FIG. 30 is a circuit diagram for illustrating a configuration of an anti-fuse address detection circuit 9100.
Figure 31:
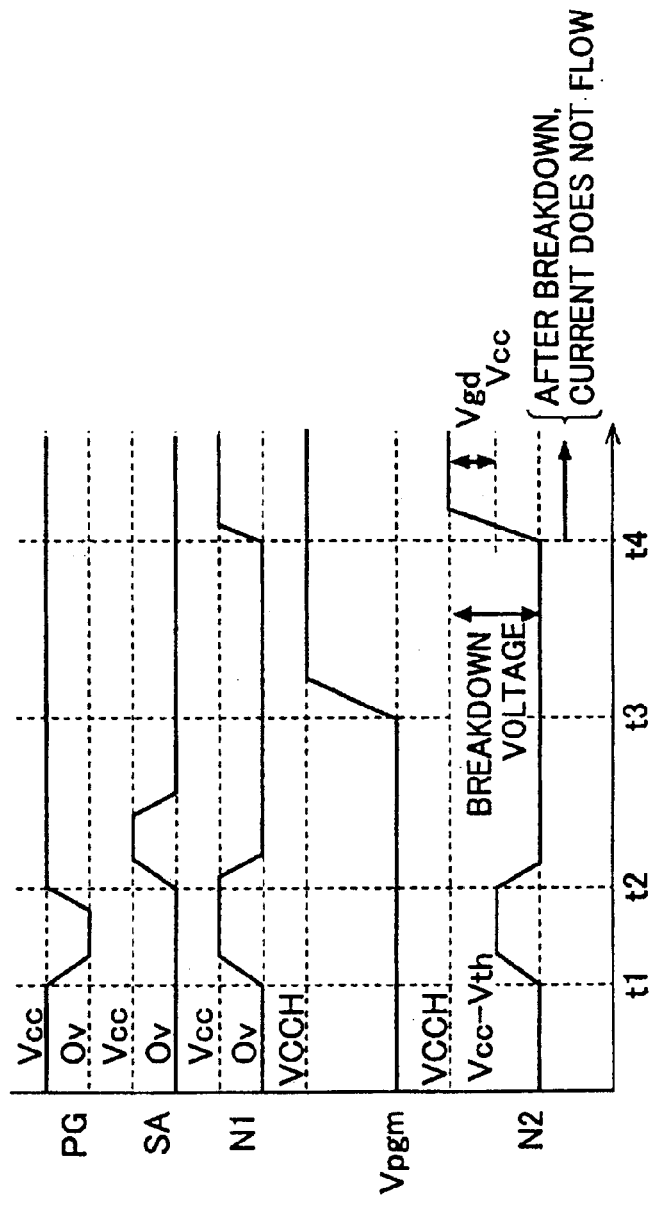
FIG. 31 is first timing plots for illustrating an operation of anti-fuse address detection circuit 9100.
Figure 32:
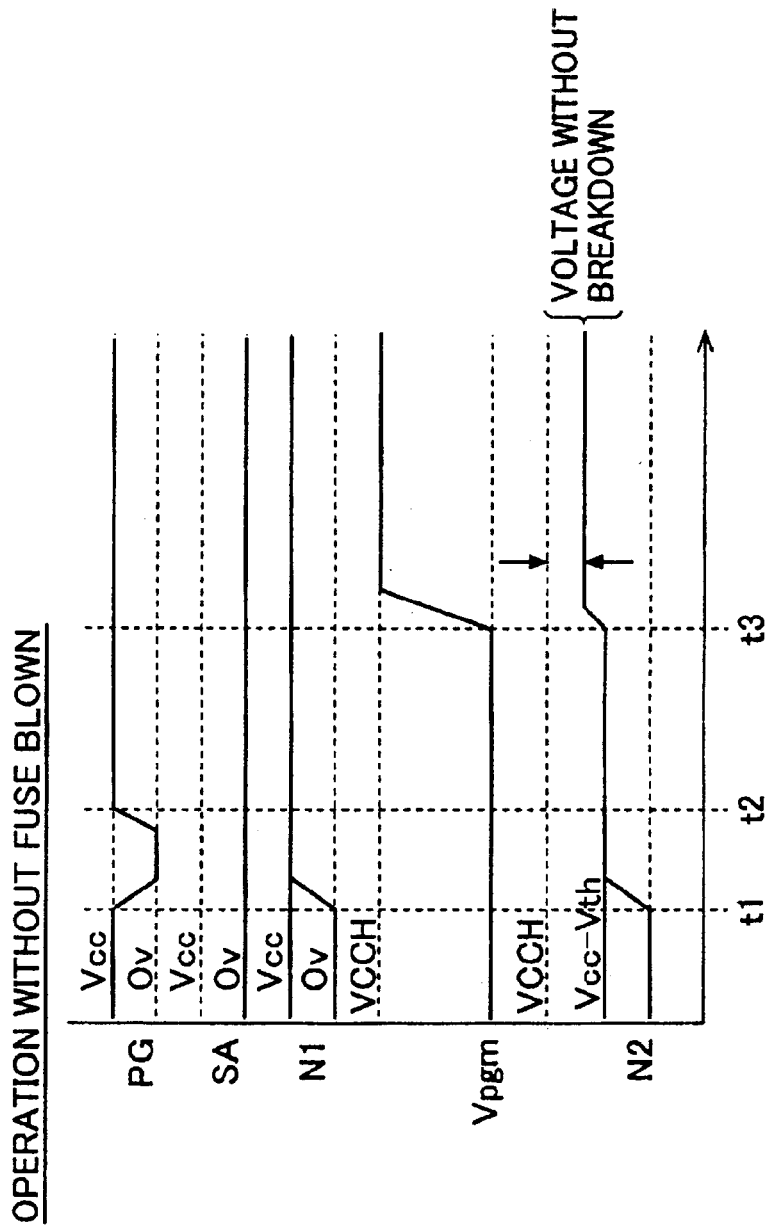
FIG. 32 is second timing plots for illustrating the operation of anti-fuse address detection circuit 9100.
Figure 33:
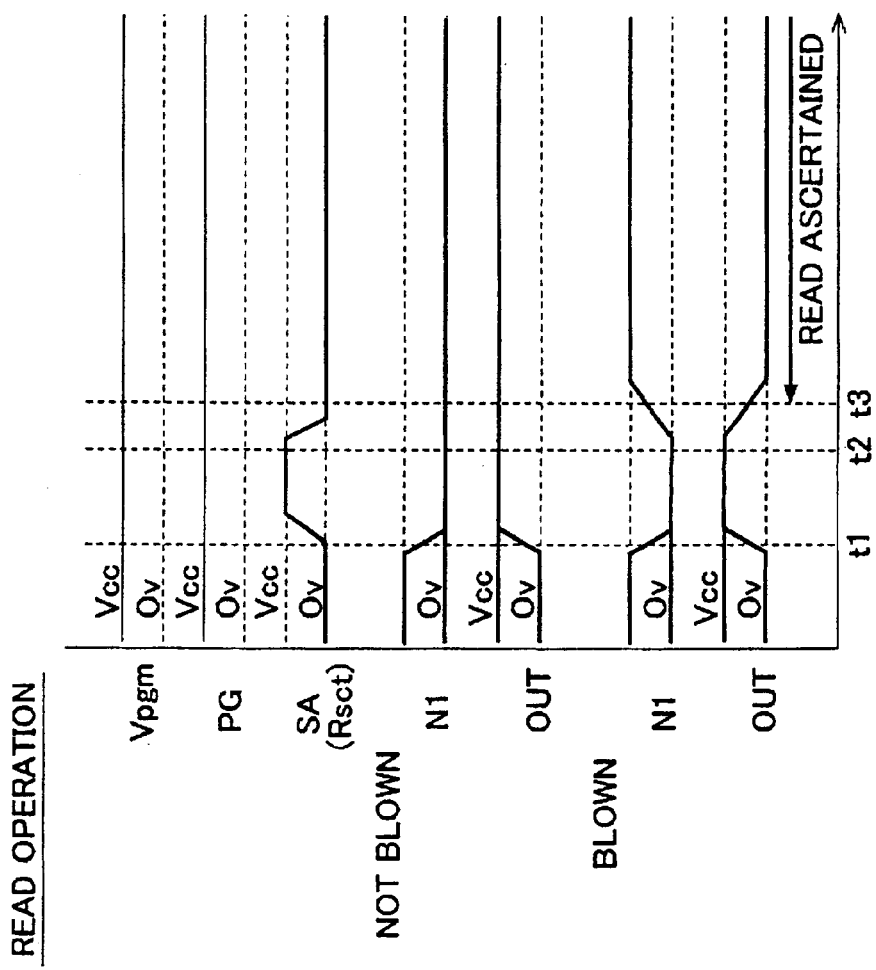
FIG. 33 is third timing plots for illustrating the operation of anti-fuse address detection circuit 9100.

FIG. 28 is a circuit diagram showing a configuration of a partial electrical fuse circuit 800 of the sixth embodiment, as compared with that described in the fifth embodiment with reference to FIG. 25.

Partial electrical fuse circuit 800 differs in configuration from partial electrical fuse circuit 700 in that transistor NQ40 has a gate receiving boosted voltage Vpp. The remainder of the configuration is similar to partial electrical fuse circuit 700, with like components labeled like reference characters.

In partial electrical fuse circuit 800 transistor NQ40 having a gate receiving boosted potential Vpp allows higher program voltage Vpgm to be applied.

Thus a higher program voltage can be used to blow electrical fuse AF10 more reliably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device storing program data therein and outputting data corresponding to said program data stored, comprising:
   a plurality of fuse elements capable of optically blowing;
   a plurality of fuse read circuits provided to correspond to said plurality of fuse elements, respectively, and each changing an output level in response to whether a corresponding one of said fuse elements has been blown;
   an electrical program circuit capable of storing said program data therein when an external electrical signal is applied; and
   a switch circuit capable of setting in a non-volatile manner which one of an output of said plurality of fuse read circuits and an output of said electrical program circuit to be output as data corresponding to said program data.

2. The semiconductor integrated circuit device of claim 1, wherein:
   said fuse elements each have one end capable of discharging to attain a predetermined potential;
   each of said plurality of fuse read circuits includes a precharge circuit operative to precharge the other end of a corresponding one of said fuse elements, and a first drive circuit outputting read data in response to a level in potential of said other end of said corresponding one of said fuse elements; and
   said electrical program circuit includes a plurality of electrical fuses settable in a non-volatile manner to have one of an electrically conducting state and an electrically breaking state, a plurality of internal nodes provided to correspond to said plurality of electrical fuses, respectively, and each coupled with said other end of said corresponding one of said fuse elements and precharged by said precharge circuit, and a second drive circuit changing a level in potential of said plurality of internal nodes in response to whether said electrical fuse has been cut off.

3. The semiconductor integrated circuit device of claim 1, wherein said electrical program circuit includes:
   a plurality of electrical fuses settable in a non-volatile manner to have one of an electrically conducting state and an electrically breaking state;
   a precharge circuit;
   a plurality of internal nodes provided to correspond to said plurality of electrical fuses, respectively, and precharged by said precharge circuit;
   a drive circuit changing a level in potential of said plurality of internal nodes in response to whether said electrical fuse has been cut off;
   a breaking circuit provided to correspond to said plurality of electrical fuses, respectively, and cutting off electrical current supplied to said corresponding one of said electrical fuses when said electrical fuse conducts; and
   a voltage alleviation circuit provided between said electrical fuse and said breaking circuit to alleviate voltage applied to said breaking circuit in a programming process.

4. A semiconductor integrated circuit device storing program data therein and outputting data corresponding to said program data stored, comprising:
   a first fuse program circuit having a plurality of first fuse elements and capable of receiving an external electrical signal to cut off said plurality of first fuse elements to store said program data therein; and a second fuse program circuit having a plurality of second fuse elements and capable of receiving an external electrical signal to cut off said plurality of second fuse elements to rewrite said program data stored in said first fuse program circuit.

5. A semiconductor memory device comprising:

a memory cell array having a plurality of memory cell arrays arranged in rows and columns, said memory cell array including a regular memory cell array and a spare memory cell array;

a regular memory cell select circuit operative in response to an address signal to select a memory cell in said regular memory cell array;

a spare memory cell select circuit operative in response to a result of comparing previously stored program data and said address signal, to select a memory cell in said spare memory cell array rather than a memory cell in said regular memory cell array; and a program circuit storing therein said program data in a non-volatile manner, said program circuit including
a first non-volatile program circuit having a plurality of first fuse elements to store said program data therein, and
a second non-volatile program circuit capable of storing said program data therein in a non-volatile manner in response to an external electrical signal being applied to rewrite said program data stored in said first fuse non-volatile program circuit.

6. The semiconductor memory device of claim 5, wherein each of said first fuse elements is capable of being optically cut off,
said first non-volatile program circuit further having a plurality of fuse read circuits provided corresponding to said plurality of first fuse elements, respectively, and changing an output level in response to whether a corresponding one of said first fuse elements has been cut off,
said program circuit further including a switch circuit capable of setting in a non-volatile manner which one of an output of said plurality of fuse read circuits and an output of said second non-volatile program circuit to be output as said program data.

7. The semiconductor memory device of claim 6, wherein said switch circuit includes a program status storage circuit storing therein in a non-volatile manner whether said program circuit has effected a process for storing program data,
said semiconductor memory device further comprises a compare circuit driven by an output of said program status storage circuit to compare an output of said program circuit and said address signal to output an instruction to said spare memory cell select circuit to select a memory cell.

8. The semiconductor memory device of claim 6, further comprising:
an address buffer receiving said address signal to generate complementary internal address signals,
wherein said program circuit stores therein program data corresponding to said complementary internal address signals; and
a compare circuit comparing an output of said program circuit and an output of said address buffer and outputting an instruction to said spare memory cell select circuit to select a memory cell.

9. The semiconductor memory device of claim 6, wherein:
each of said first fuse elements has one end capable of discharging to attain a predetermined potential;
each of said plurality of fuse read circuits includes
a precharge circuit operative to precharge the other end of a corresponding one of said first fuse elements, and
a first drive circuit outputting read data in response to a level in potential of said other end of said corresponding one of said first fuse elements; and
said second non-volatile program circuit includes
a plurality of second fuse elements each electrically settable in a non-volatile manner to have one of an electrically conducting state and an electrically non-conducting state,
a plurality of internal nodes provided corresponding to said plurality of second fuse elements, respectively, and each coupled with said other end of said corresponding one of said first fuse elements and precharged by said precharge circuit, and
a plurality of second drive circuits each changing a level in potential of one of said plurality of internal nodes in response to whether said second fuse element has been cut off.

10. The semiconductor memory device of claim 6, wherein said second non-volatile program circuit includes:
a plurality of second fuse elements each electrically settable in a non-volatile manner to have one of an electrically conducting state and an electrically non-conducting state;
a precharge circuit;
a plurality of internal nodes provided corresponding to said plurality of second fuse elements, respectively, and precharged by said precharge circuit;
a plurality of drive circuits each changing a level in potential of one of said plurality of internal nodes in response to whether said second fuse element has been cut off;
a plurality of cutoff circuits provided corresponding to said plurality of second fuse elements, respectively, and each cutting off electrical current supplied to said corresponding one of said second fuse elements when said second fuse element conducts; and
a plurality of voltage alleviation circuits each provided between said second fuse element and said cutoff circuit to alleviate voltage applied to said cutoff circuit in a programming process.

11. The semiconductor memory device of claim 5, wherein
said first non-volatile program circuit is capable of receiving an external electrical signal to cut off said plurality of first fuse elements to store said program data therein.

* * * * *